United States Patent
Seo et al.

(10) Patent No.: US 12,322,664 B2
(45) Date of Patent: Jun. 3, 2025

(54) DISPLAY PANEL AND TEST METHOD THEREOF

(71) Applicant: Samsung Display Co., LTD., Yongin-si (KR)

(72) Inventors: Hae Kwan Seo, Yongin-si (KR); Young Ha Sohn, Yongin-si (KR); Woo Mi Bae, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 752 days.

(21) Appl. No.: 17/342,108

(22) Filed: Jun. 8, 2021

(65) Prior Publication Data

US 2022/0068727 A1    Mar. 3, 2022

(30) Foreign Application Priority Data

Aug. 28, 2020   (KR) .......................... 10-2020-0109694

(51) Int. Cl.
*H01L 21/66*    (2006.01)
*G01R 31/28*    (2006.01)
*H01L 25/16*    (2023.01)

(52) U.S. Cl.
CPC .......... *H01L 22/22* (2013.01); *G01R 31/2825* (2013.01); *H01L 25/167* (2013.01)

(58) Field of Classification Search
CPC ............... G09G 3/3233; G09G 3/3291; G09G 2320/0295; G01R 31/2635
See application file for complete search history.

(56) References Cited

U.S. PATENT DOCUMENTS

| 8,957,696 | B2 * | 2/2015 | Von Staudt | G09G 3/006 324/762.07 |
| 9,922,585 | B2 | 3/2018 | Kim et al. | |
| 9,940,860 | B2 | 4/2018 | Kang et al. | |
| 10,254,875 | B2 | 4/2019 | Hong et al. | |
| 10,726,775 | B2 * | 7/2020 | Yoo | G09G 3/32 |
| 11,017,699 | B2 | 5/2021 | Kim et al. | |
| 11,688,314 | B2 | 6/2023 | Lee et al. | |

(Continued)

FOREIGN PATENT DOCUMENTS

| CN | 101038300 | 9/2007 |
| CN | 105912150 | 8/2016 |

(Continued)

OTHER PUBLICATIONS

International Search Report corresponding to International Application No. PCT/KR2021/010294 dated Nov. 22, 2021.

(Continued)

*Primary Examiner* — Jermele M Hollington
*Assistant Examiner* — Temilade S Rhodes-Vivour
(74) *Attorney, Agent, or Firm* — KILE PARK REED & HOUTTEMAN PLLC

(57) ABSTRACT

A method of testing a display panel includes applying a test voltage to each of data lines; applying a gate signal to each of the gate lines; measuring a sensing voltage applied to end of the light emitting unit of each of the pixels by the pixel circuit in response to the gate signal and the test voltage; and determining whether the light emitting elements are validly connected in series within the light emitting unit of each of the pixels based on the sensing voltage.

13 Claims, 15 Drawing Sheets

(56) References Cited

U.S. PATENT DOCUMENTS

| | | | |
|---|---|---|---|
| 2007/0080913 A1 | 4/2007 | Park et al. | |
| 2008/0136338 A1* | 6/2008 | Troccoli | G09G 3/3233 |
| | | | 315/169.3 |
| 2013/0135324 A1* | 5/2013 | Hong | G09G 3/3466 |
| | | | 359/290 |
| 2016/0086544 A1 | 3/2016 | Park et al. | |
| 2017/0186371 A1* | 6/2017 | Takahashi | G06F 3/0446 |
| 2017/0205913 A1* | 7/2017 | Kimura | G02F 1/13338 |

FOREIGN PATENT DOCUMENTS

| | | |
|---|---|---|
| CN | 106291999 | 1/2017 |
| CN | 110097842 | 8/2019 |
| JP | 2016-139078 | 8/2016 |
| KR | 10-0543714 | 1/2006 |
| KR | 10-2006-0106323 | 10/2006 |
| KR | 10-2007-0040505 | 4/2007 |
| KR | 10-2010-0072509 | 7/2010 |
| KR | 10-2014-0133702 | 11/2014 |
| KR | 10-2015-0129931 | 11/2015 |
| KR | 10-2016-0001839 | 1/2016 |
| KR | 10-2016-0148834 | 12/2016 |
| KR | 10-2017-0066744 | 6/2017 |
| KR | 10-2019-0118223 | 10/2019 |
| KR | 10-2020-0026385 | 3/2020 |

OTHER PUBLICATIONS

Notice of Allowance for Korean Patent Application or Patent No. 10-2020-0109694, dated Aug. 5, 2024.
Chinese Office Action dated Mar. 29, 2025, in Chinese Patent Application No. 202180040962.8.

\* cited by examiner

DISPLAY PANEL AND TEST METHOD THEREOF

CROSS-REFERENCE TO RELATED APPLICATION(S)

This application claims priority to and the benefit of Korean Patent Application No. 10-2020-0109694 under 35 U.S.C. § 119, filed in the Korean Intellectual Property Office (KIPO) on Aug. 28, 2020, the entire contents of which are incorporated herein by reference.

BACKGROUND

1. Technical Field

The disclosure relates to a display panel and a test method thereof.

2. Description of the Related Art

With an increasing interest in information displays and an increasing demand for portable information media, the demand and commercialization of display devices have been focused on.

SUMMARY

An embodiment of the disclosure provides a test method of a display panel capable of determining whether light emitting elements are normally or validly aligned within pixels in the display panel.

An embodiment of the disclosure provides a display panel capable of determining whether light emitting elements are validly aligned for each pixel.

A method of testing a display panel according to an embodiment of the disclosure may test the display panel. The display panel may include pixels electrically connected to gate lines and data lines, and each of the pixels may include a pixel circuit electrically connected to a corresponding one of the gate lines and a corresponding one of the data lines, and a light emitting unit including an end electrically connected to the pixel circuit. A method of testing a display panel may include applying a test voltage to each of data lines; applying a gate signal to each of gate lines; measuring a sensing voltage applied to the end of the light emitting unit of each of the pixels by the pixel circuit in response to the gate signal and the test voltage; and determining whether the light emitting elements are validly connected in series in the light emitting unit of each of the pixels based on the sensing voltage.

In an embodiment, the test voltage may be greater than a reference voltage, and the reference voltage may be equal to a voltage difference between a total operating voltage of the light emitting elements electrically connected in series and an operating voltage of one of the light emitting elements.

In an embodiment, the test voltage may be less than or equal to the total operating voltage of the light emitting elements.

In an embodiment, the determining of whether the light emitting elements are validly connected in series may include determining that all of the light emitting elements are validly aligned in case that the sensing voltage is greater than the reference voltage.

In an embodiment, the determining of whether the light emitting elements are validly connected in series includes determining that at least one of the light emitting elements is invalidly aligned in case that the sensing voltage is less than or equal to the reference voltage.

In an embodiment, the method may further include in case that the sensing voltage is less than or equal to the reference voltage, determining that the at least one of the light emitting elements is short-circuited, and physically opening the at least one of the light emitting elements by a repair process.

In an embodiment, the applying of the test voltage to each of the data lines may include applying the test voltage to a first pad; and sequentially applying the test voltage to at least a part of the data lines through a first demultiplexer electrically connected between the first pad and the data lines.

In an embodiment, the first demultiplexer may include sub-demultiplexers, and the sequentially applying of the test voltage to the at least a part of the data lines may include applying simultaneously the test voltage to a part of the data lines through the sub-demultiplexers.

In an embodiment, the applying of the gate signal to each of the gate lines may include applying the gate signal to a second pad; and sequentially applying the gate signal to the gate lines through a second demultiplexer electrically connected between the second pad and the gate lines.

In an embodiment, the sequentially applying of the gate signal to the gate lines may include sequentially applying the gate signal to the gate lines while the test voltage is applied to one of the data lines.

In an embodiment, the display panel may further include sensing scan lines and sensing lines. The pixel circuit may include a sensing transistor electrically connected between the end of the light emitting unit and a corresponding one of the sensing lines, the sensing transistor including a gate electrode electrically connected to a corresponding one of the sensing scan lines, and the gate signal may be simultaneously applied to one of the gate lines and one of the sensing lines through the second demultiplexer.

In an embodiment, the first demultiplexer may sequentially connect at least a part of the sensing lines to third pads.

In an embodiment, the measuring of the sensing voltage may include applying the test voltage to a gate electrode of a driving transistor in the pixel circuit in response to the gate signal; supplying an initialization voltage to an electrode of the driving transistor electrically connected to the end of the light emitting unit through a sensing line; stopping supply of the initialization voltage while the test voltage is applied; and measuring the sensing voltage changed based on a current flowing through the sensing line.

A display panel according to an embodiment of the disclosure may include a substrate including a first area and a second area surrounding the first area; gate lines, data lines, and pixels disposed in the first area and electrically connected to the gate lines and the data lines; a first pad and a second pad disposed in the second area; and a first demultiplexer disposed in the second area and electrically connected between the first pad and the data lines, wherein each of the pixels may include a pixel circuit electrically connected to a corresponding one of the gate lines and a corresponding one of the data lines, and a light emitting unit including an end electrically connected to the pixel circuit, and the light emitting unit may include light emitting elements electrically connected in series.

In an embodiment, the first demultiplexer may sequentially connect the first pad to at least a part of the data lines.

In an embodiment, the first demultiplexer may include sub-demultiplexers, and the first pad may be simultaneously connected to a part of the data lines through the sub-demultiplexers.

In an embodiment, the display panel may further include a second demultiplexer disposed in the second area and electrically connected between the second pad and the gate lines.

In an embodiment, the display panel may further include sensing scan lines and sensing lines, and the pixel circuit may include a driving transistor electrically connected to the end of the light emitting unit; a switching transistor electrically connected between a gate electrode of the driving transistor and a corresponding one of the data lines, and the switching including a gate electrode electrically connected to a corresponding gate line of the gate lines; and a sensing transistor electrically connected between the end of the light emitting unit and a corresponding one of the sensing lines, and the sensing transistor including a gate electrode electrically connected to a corresponding one of the sensing scan lines.

In an embodiment, the gate lines may be respectively connected to the sensing scan lines in the second area.

In an embodiment, the display panel may further include third pads disposed in the second area, and the first demultiplexer may sequentially connect at least a part of the sensing lines to the third pads.

A method of testing a display panel according to embodiments of the disclosure may determine whether the light emitting elements in the pixel are validly aligned (i.e., an alignment state of the light emitting elements), based on a voltage level (or a threshold voltage sensed for a driving transistor) sensed at an end (i.e., a node connected to a driving transistor) of a light emitting unit.

The display panel according to embodiments of the disclosure may further include a first demultiplexer selectively connecting data lines to a test pad and may determine an alignment state of light emitting elements for each pixel.

A repair operation or the like can be performed on invalidly aligned light emitting elements, and thus, luminance deviation due to invalid alignment of at least a part of the light emitting elements in the pixel can be improved, and display quality may be improved.

Effects of embodiments of the disclosure is not limited by what is illustrated in the above, and more various effects are included in the specification.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
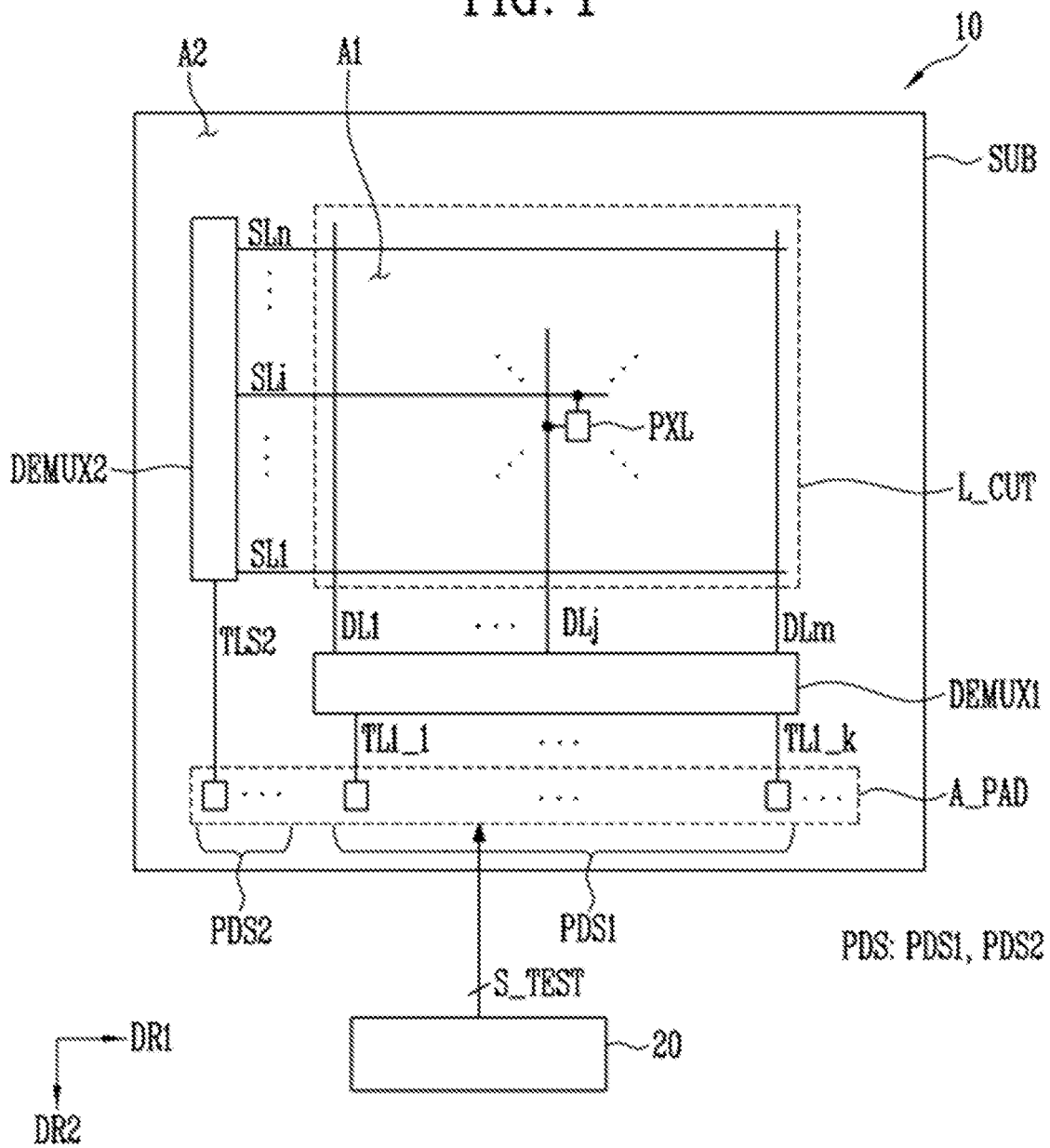
FIG. 1 is a schematic block diagram illustrating a display panel according to embodiments of the disclosure.

It will be apparent to those skilled in the art that various modifications and variations can be made in the disclosure without departing from the spirit or scope of the disclosure, and specific embodiments are exemplified in the drawings and explained in the detailed description. Thus, it is intended that the disclosure covers the modifications and variations of this disclosure provided they come within the scope of the disclosure and their equivalents.

Like reference numerals designate like elements throughout the specification. In the accompanying drawings, dimensions of structures are exaggerated for clarity. The terms "first," "second" and the like may be simply used for description of various constituent elements, but those meanings may not be limited to the restricted meanings. The above terms are used only for distinguishing one element from other elements. For example, a first element may be referred to as a second element and similarly, the second element may be referred to as the first element within the scope of the appended claims.

In the specification, the word "comprise," "include," or "has" is used to specify existence of a feature, numbers, a process, an operation, an element, a part, or a combination thereof, and it will be understood that existence or additional possibility of one or more other features or numbers, processes, operations, elements, parts, or combinations thereof are not excluded. In addition, it will be understood that when an element such as a layer, film, region, or substrate is referred to as being "on" another element, it can be directly on the other element or intervening elements may also be present. In the specification, it will be understood that when an element such as a layer, film, region, or substrate is referred to as being disposed "on" another element, the disposed direction is not limited to an upper direction and include a side direction or a lower direction. In contrast, it will be understood that when an element such as a layer, film, region, or substrate is referred to as being "beneath" another element, it can be directly beneath the other element or intervening elements may also be present.

In the application, when a component (for example, "first component") is referred to as being "(operatively or communicatively) coupled with/to" or "connected to" another component (for example, a "second component"), it should be understood that the component may be directly connected to the another component or may be connected through another component (for example, "third component"). On the other hand, when a component (for example, "first component") is referred to as being "directly coupled" or "directly connected" to another component (for example, a "second component"), it may be understood that no other component (for example, a "third component") exists between the one component and the another component.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly defined herein.

Hereinafter, with reference to accompanying drawings, an embodiment of the disclosure and others required for those skilled in the art to understand the contents of the disclosure will be described in more detail. The terms of a singular form may include plural forms unless referred to the contrary.

Figure 2:
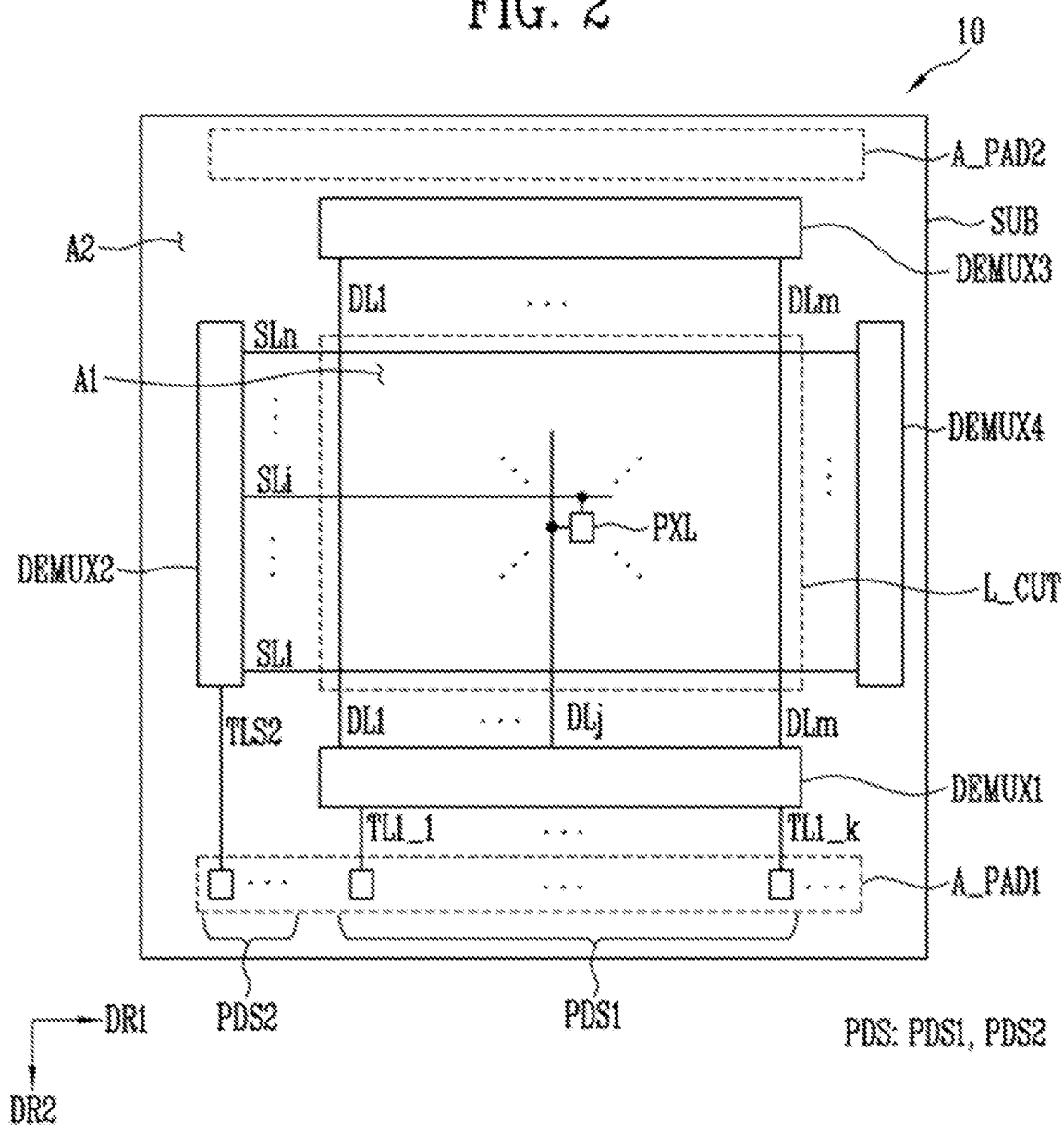
FIGS. 2 and 3 are schematic block diagrams illustrating an example of the display panel of FIG. 1.
Figure 3:
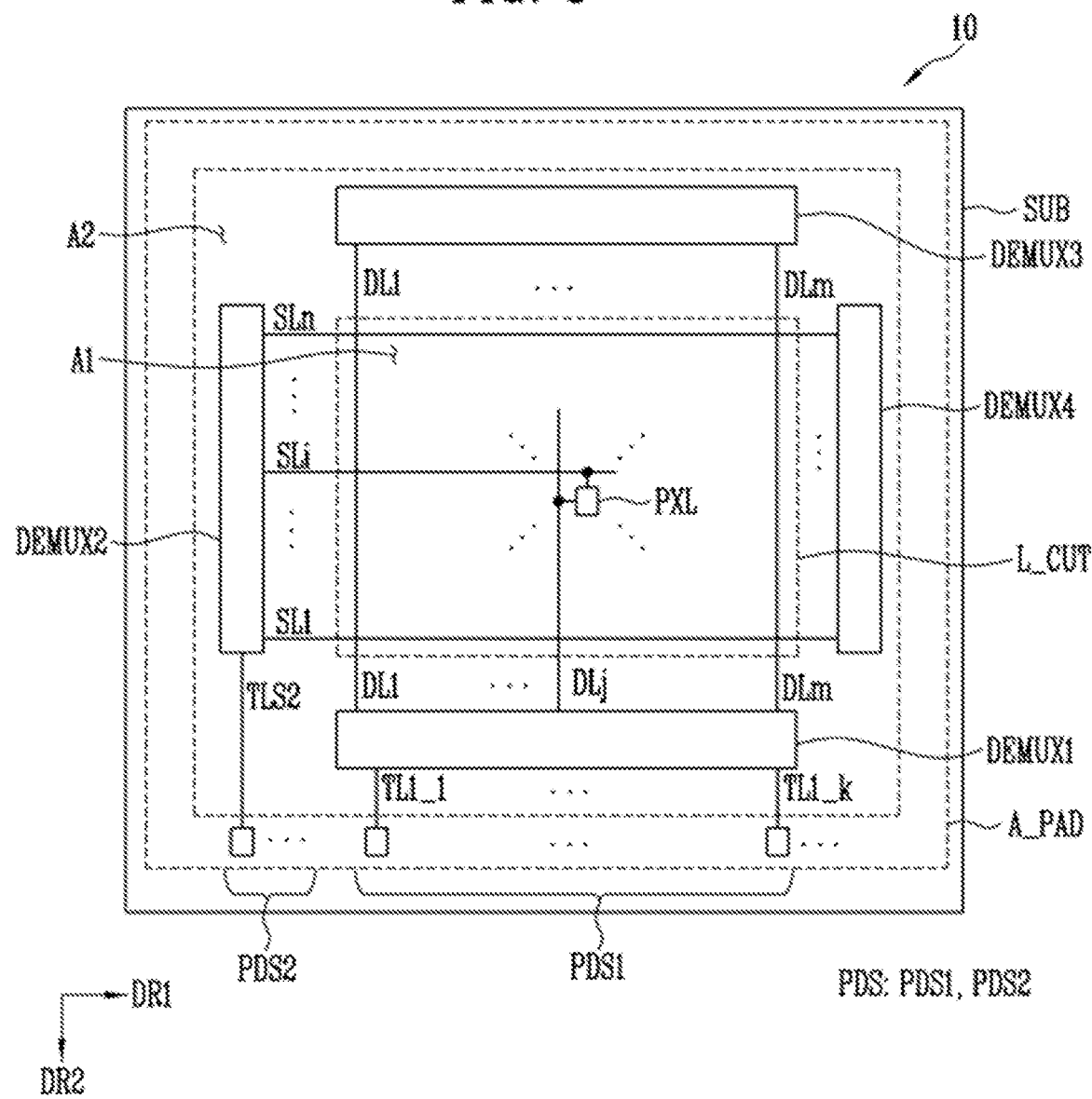

FIG. 1 is a schematic block diagram illustrating a display panel according to an embodiment of the disclosure. FIGS. 2 and 3 are schematic block diagrams illustrating an example of the display panel of FIG. 1.

First, referring to FIG. 1, the display panel 10 may include a substrate SUB, scan lines (or gate lines) SL1 to SLn (here, n is a positive integer), data lines DL1 to DLm (here, m is a positive integer), and pixels PXL. Also, the display panel 10 may include pads PDS, a first demultiplexer DEMUX1, and a second demultiplexer DEMUX2.

The substrate SUB may include a transparent insulation material and transmit light. The substrate SUB may be a rigid substrate or a flexible substrate.

The substrate SUB may include a first area A1 and a second area A2 surrounding the first area A1.

For example, the substrate SUB may be a mother substrate that is a basis for manufacturing a panel, and the first area A1 of the substrate SUB cut along a cutting line L_CUT may be used as a panel (i.e., a display panel or a cell provided in a display device).

The scan lines SL1 to SLn, the data lines DL1 to DLm, and the pixels PXL may be disposed in the first area A1, and the pads PDS, the first demultiplexer DEMUX1, and the second demultiplexer DEMUX2 may be disposed in the second area A2.

The scan lines SL1 to SLn may extend in the first direction DR1 and may be arranged in the second direction DR2. The data lines DL1 to DLm may extend in the second direction DR2 and may be arranged in the first direction DR1.

The pixel PXL may be provided in an area (e.g., a pixel area) partitioned by the scan lines SL1 to SLn and the data lines DL1 to DLm.

The pixel PXL may be electrically connected to a corresponding one of the scan lines SL1 to SLn and a corresponding one of the data lines DL1 to DLm. For example, in case that the pixel PXL is disposed in the i-th row (here, i is a positive integer less than or equal to n) and the j-th column (here, j is a positive integer less than or equal to m), the pixel PXL may be electrically connected to the i-th scan line SLi and the j-th data line DLj.

According to an embodiment, the display panel 10 may include sensing scan lines arranged parallel to the scan lines SL1 to SLn and sensing lines (or readout lines) arranged parallel to the data lines DL1 to DLm, and the pixel PXL may be further electrically connected to a corresponding one of the sensing scan lines and a corresponding one of the sensing lines. The sensing scan lines and sensing lines will be described below with reference to FIGS. 4 and 9.

The pixel PXL may include light emitting elements and at least one transistor providing a driving current to the light emitting elements.

The pixel PXL may emit light with luminance corresponding to a data signal (or a data voltage) provided through a data line in response to a first gate signal (or a first scan signal) provided through the scan line. The pixel PXL may output information on characteristics of the light emitting element (e.g., a sensing voltage, or a sensing current as information on a threshold voltage of the driving transistor) in response to a second gate signal (or a second scan signal) provided through the sensing scan line through a sensing line.

A detailed configuration of the pixel PXL will be described below with reference to FIG. 4.

The pads PDS may be disposed in a pad area A_PAD adjacent to at least one side of the first area A1. The pad area A_PAD may be included in the second area A2. For example, as shown in FIG. 1, the pads PDS may be disposed in the pad area A_PAD positioned in the second direction DR2 with respect to the first area A1. For another example, as shown in FIG. 2, the pads PDS may be disposed in a first pad area A_PAD1 and a second pad area A_PAD2 positioned in the second direction DR2 with the first area A1 being disposed therebetween. For another example, as shown in FIG. 3, the pads PDS may be disposed in the pad area A_PAD surrounding the first area A1. For example, the pads PDS may be disposed adjacent to at least one side of the first area A1 according to the number (or quantity) of the pads PDS.

The pads PDS may include first pads PDS1 and second pads PDS2. The first pads PDS1 may be electrically connected to an external test device 20 and may receive a test voltage (or test signal S_TEST) and first demux control signals (or first demultiplexer control signal) from the test device 20. The second pads PDS2 are electrically connected to the test device 20 and may receive a gate signal (or a scan signal) and second demux control signals from the test device 20. The test voltage, the first demux control signals, the gate signals, and the second demux control signals will be described below with reference to FIGS. 6 and 12.

The first demultiplexer DEMUX1 may be electrically connected to the data lines DL1 to DLm and may be also electrically connected to the first pads PDS1 through first test lines TL1_1 to TL1_$k$ (here, k is a positive integer smaller than m). The first demultiplexer DEMUX1 may selectively connect some of the data lines DL1 to DLm to the first pads PDS1 in response to the first demux control signals. For example, the test voltage applied to the first pads PDS1 may be selectively applied to the data lines DL1 to DLm. In case that the first demultiplexer DEMUX1 sequentially connects the data lines DL1 to DLm to the first pads PDS1 in response to the first demux control signals, the test voltage applied to the first pads PDS1 may be sequentially applied to the data lines DL1 to DLm.

For reference, in order to individually test an alignment state (or a lighting state) of the internal light emitting elements for each pixel PXL, test pads (i.e., pads PDS) individually connected to each of the pixels PXL (or pixel columns) may be required, and a pad area A_PAD having a larger area may be required to arrange the test pads. Accordingly, an area ratio of the second area A2 in the substrate SUB increases, but an area ratio of the first area A1 in the substrate SUB decreases, and the manufacturing cost of the panel (or cell) may increase. A test device having the number of channels corresponding to the number of the test pads may be required, and test cost (or manufacturing cost) may increase.

The display panel 10 according to embodiments of the disclosure may selectively connects the first pads PDS1 to at least some of the pixels PXL using the first demultiplexer DEMUX1, through which, the number of first pads PDS1 (or pads PDS) may decrease.

The second demultiplexer DEMUX2 may be electrically connected to the scan lines SL1 to SLn and may also be electrically connected to the second pads PDS2 through the second test lines TLS2. The second demultiplexer DEMUX2 may selectively connect some of the scan lines SL1 to SLn to the second pads PDS2 in response to the second demux control signals. For example, the gate signal applied to the second pads PDS2 may be selectively applied to the scan lines SL1 to SLn. In case that the second demultiplexer DEMUX2 sequentially connects the scan lines SL1 to SLn to the second pads PDS2 in response to the second demux control signals, the gate signal applied to the second pads PDS2 may be sequentially applied to the scan lines SL1 to SLn.

In another embodiment, the second demultiplexer DEMUX2 may be implemented as a shift register (or a scan driving circuit) which sequentially generates and outputs a pulsed gate signal using first demux control signals (or clock signals).

Since the second pads PDS2 are selectively connected to at least some of the pixels PXL by using the second demultiplexer DEMUX2, the number of the second pads PDS2 (or pads PDS) may decrease.

In FIG. 1, the first demultiplexer DEMUX1 is positioned in the second direction DR2 with respect to the first area A1, and the second demultiplexer DEMUX2 is positioned in the direction opposite to the first direction DR1 with respect to the first area A1, but the arrangement is not limited thereto. For example, as shown in FIGS. 2 and 3, the display panel 10 may further include a third demultiplexer DEMUX3 and a fourth demultiplexer DEMUX4. The third demultiplexer DEMUX3 may be positioned in the direction opposite to the second direction R2 with respect to the first area A1 and may selectively (e.g., sequentially) connect some of the data lines DL1 to DLm to the pads disposed in the second pad area A_PAD2. The fourth demultiplexer DEMUX4 may be positioned in the first direction DR1 with respect to the first area A1 and may also selectively (e.g., sequentially) connect at least some of the scan lines SL1 to SLn to the pads disposed in the second pad area A_PAD2.

The test device 20 may detect or measure a sensing signal (e.g., a sensing voltage) output through sensing lines from the pixels PXL according to the test voltage and may determine the alignment state (or the lighting state) of the internal light emitting elements each of the pixels PXL based on the sensing signal.

In an embodiment, in case that the sensing signal is within a reference range (e.g., in case that it is greater than the reference voltage), the test device 20 may determine that the alignment state of the light emitting elements in the corresponding pixel PXL is normal or valid. In another embodiment, in case that the sensing signal is out of a reference range (e.g., in case that it is less than or equal to the reference voltage), the test device 20 may determine that the alignment state of the light emitting elements in the corresponding pixel PXL is abnormal or invalid. A configuration for determining the alignment state of the light emitting elements in the pixel PXL will be described below with reference to FIGS. 4 to 8 together with the structure of the pixel PXL.

As described with reference to FIGS. 1 to 3, the display panel 10 may selectively provide a test voltage applied to the first pads PDS1 to the pixels PXL (or pixel columns) by using the first demultiplexer DEMUX1 and may selectively provide a gate signal applied to the second pads PDS2 to the pixels PXL (or pixel rows) by using the second demultiplexer DEMUX2. Accordingly, the total number of pads PDS may relatively decrease, and the manufacturing cost of the panel may decrease.

Figure 4:
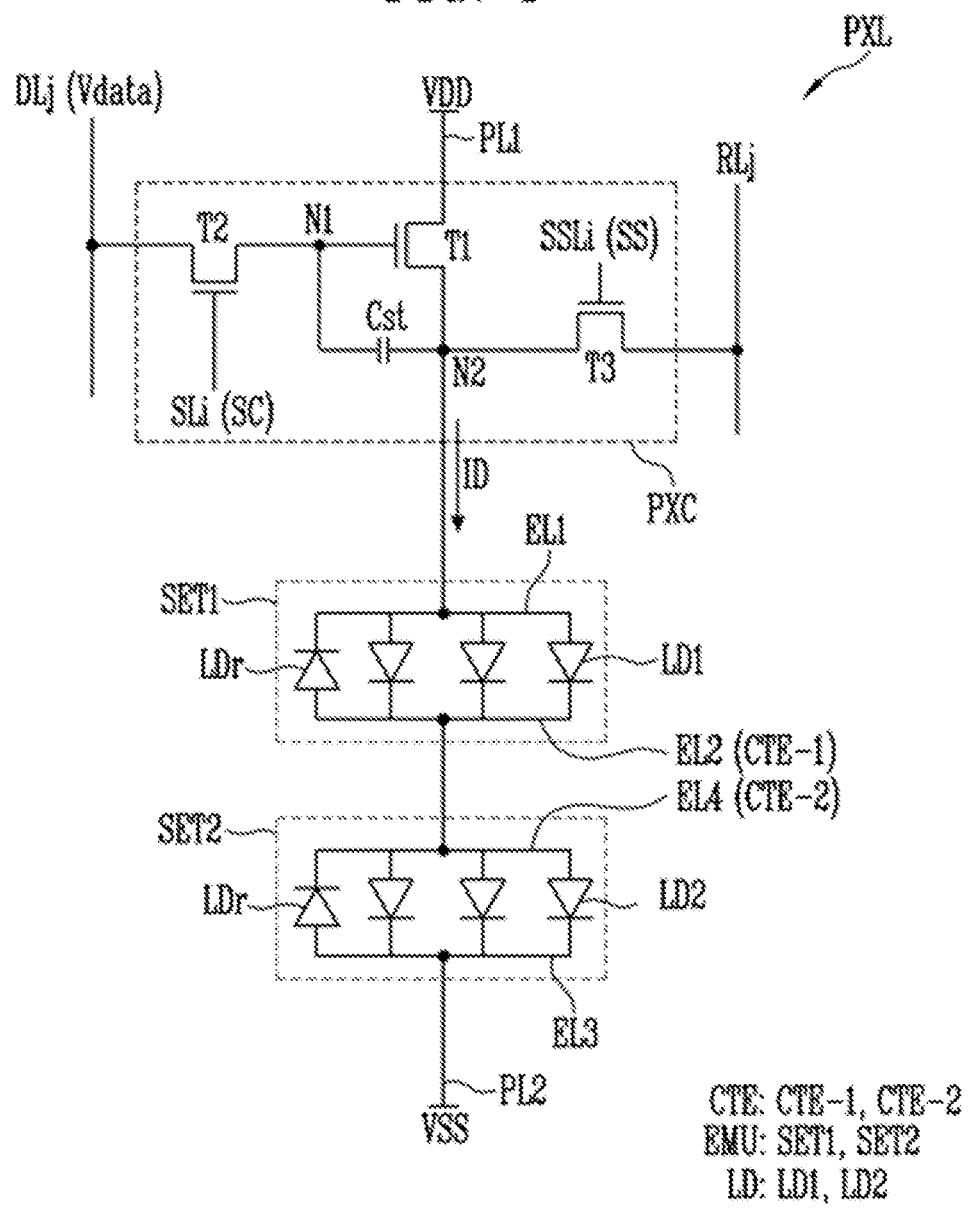
FIG. 4 is a schematic circuit diagram illustrating an example of a pixel included in the display panel of FIG. 1.

FIG. 4 is a schematic circuit diagram illustrating an example of a pixel included in the display panel of FIG. 1.

Referring to FIG. 4, the pixel PXL may include a light emitting unit EMU which generates light having luminance corresponding to a data signal. The pixel PXL may selectively further include a pixel circuit PXC for driving the light emitting unit EMU.

The light emitting unit EMU may include light emitting elements LD electrically connected in parallel between a first power line PL1 to which a first power voltage VDD is applied and a second power line PL2 to which a second power voltage VSS is applied. The first power line PL1 and the second power line PL2 may be electrically connected to some (e.g., separate power pads) of the pads PDS described with reference to FIG. 1.

For example, the light emitting unit EMU may include a first electrode EL1 (or first alignment electrode) electrically connected to the first power line PL1 via the pixel circuit PXC and the first power line PL1, a third electrode EL3 (or second alignment electrode) electrically connected to the second power line PL2, and light emitting elements LD which are electrically connected in parallel in the same direction between the first and third electrodes EL1 and EL3. In an embodiment of the disclosure, the first electrode EL1 may be an anode electrode, and the third electrode EL3 may be a cathode electrode.

Each of the light emitting elements LD included in the light emitting unit EMU may include one end electrically connected to the first power line PL1 through the first electrode EL1, and another end electrically connected to the second power line PL2 through the third electrode EL3.

Each light emitting element LD electrically connected in parallel in the same direction between the first electrode EL1 and the third electrode EL3 receiving respectively voltages of different potentials (i.e., the first power voltage VDD and the second power voltage VSS), may form (or constitute) each effective light source. These effective light sources may be gathered to form the light emitting unit EMU of the pixel PXL.

The light emitting elements LD of the light emitting unit EMU may emit light with luminance corresponding to the driving current supplied through the corresponding pixel circuit PXC. For example, the pixel circuit PXC may supply the driving current corresponding to the voltage level of the data signal Vdata applied through the j-th data line DLj to the light emitting unit EMU. The driving current supplied to the light emitting unit EMU may be divided and flowed through the light emitting elements LD. Accordingly, while each light emitting element LD emits light with a luminance corresponding to the current flowing therein, the light emitting unit EMU may emit light of a luminance corresponding to the driving current.

The light emitting unit EMU may further include at least one non-effective light source, for example, a reverse light emitting element LDr, in addition to the light emitting elements LD forming each effective light source. The reverse light emitting element LDr may be electrically connected in parallel between the first and third electrodes EL1 and EL3 together with the light emitting elements LD forming effective light sources and may be electrically connected between the first and third electrodes EL1 and EL3 in the direction opposite to the light emitting elements LD (or in the different polarity direction). The reverse light emitting element LDr may maintain an inactive state even in case that a predetermined driving voltage (e.g., a driving voltage of forward direction) is applied between the first and third electrodes EL1 and EL3, so that a current does not substantially flow through the reverse light emitting element LD.

The pixel circuit PXC may be electrically connected to the i-th scan line SLi, the i-th sensing scan line SSLi, the j-th data line DLj, and the j-th sensing line RLj of the corresponding pixel PXL.

According to an embodiment, the pixel circuit PXC may include first, second, and third transistors T1, T2, and T3 and a storage capacitor Cst. However, the structure of the pixel circuit PXC is not limited to the embodiments shown in FIG. 4.

A first terminal (or a first electrode) of the first transistor T1 (or a driving transistor) may be electrically connected to the first power line PL1, and a second terminal (or a second electrode) thereof may be electrically connected to a second node N2 (or the first electrode EL1). Here, the first terminal and the second terminal of the first transistor T1 may be different terminals. For example, in case that the first terminal is a drain electrode, the second terminal may be a source electrode. The gate electrode of the first transistor T1 may be electrically connected to the first node N1. The first transistor T1 may control an amount of the driving current supplied to the light emitting elements LD in response to the voltage of the first node N1.

A first terminal of the second transistor T2 (or a switching transistor) may be electrically connected to the j-th data line DLj, and a second terminal thereof may be electrically connected to the first node N1. A gate electrode of the second transistor T2 may be electrically connected to the i-th scan line SLi. The second transistor T2 may be turned on in case that a scan signal SC (or a first gate signal) of a gate-on voltage (e.g., a high voltage) capable of turning on the second transistor T2 is supplied from the i-th scan line SLi, to electrically connect the j-th data line DLj and the first node N1. In this case, the data signal Vdata may be supplied to the j-th data line DLj, and thus the data signal Vdata may be transferred to the first node N1. The data signal Vdata transferred to the first node N1 may be charged in the storage capacitor Cst.

One electrode of the storage capacitor Cst may be electrically connected to the first node N1 and the other electrode thereof may be electrically connected to the second node N2. The storage capacitor Cst may be charged with a voltage corresponding to the data signal Vdata supplied to the first node N1 and may maintain the charged voltage until the next data signal Vdata is supplied.

A first terminal of the third transistor T3 (or a sensing transistor) may be electrically connected to the second node N2, and a second terminal thereof may be electrically connected to the j-th sensing line RLj. A gate electrode of the third transistor T3 may be electrically connected to the j-th sensing scan line SSLi. In case that the j-th sensing line RLj is omitted, the second terminal of the third transistor T3 may be electrically connected to the j-th data line DLj. In case that the i-th sensing scan line SSLi is omitted, a gate electrode of the third transistor T3 may be electrically connected to the i-th scan line SLi. The third transistor T3 may be turned on by the sensing scan signal SS (or a second gate signal) of a gate-on voltage (e.g., a high level) supplied to the i-th sensing scan line SSLi to electrically connect the j-th sensing line RLj and the second node N2.

According to an embodiment, during the test period, by applying a test voltage capable of turning on the first transistor T1 to the first node N1 through the j-th data line DLj and the second transistor T2, the first transistor T1 may be turned on. By supplying the sensing scan signal SS of the gate-on voltage to the third transistor T3 to turn on the third transistor T3, the first transistor T1 may be electrically connected to the j-th sensing line RLj. Accordingly, a sensing voltage corresponding to the threshold voltage of the first transistor T1 may be extracted through the j-th sensing line RLj described above. The extracted sensing voltage may be used to determine the alignment state of the light emitting elements LD in the light emitting unit EMU.

FIG. 4 illustrates an embodiment in which the first, second, and third transistors T1, T2, and T3 are all N-type transistors, but the disclosure is not limited thereto. For example, at least one of the first, second, and third transistors T1, T2, and T3 described above may be changed to a P-type transistor. FIG. 4 illustrates an embodiment in which the light emitting unit EMU is electrically connected between the pixel circuit PXC and the second power line PL2, but the light emitting unit EMU may be electrically connected between the first power line PL1 and the pixel circuit PXC.

The light emitting unit EMU may include a first stage SET1 (or a first stack or a first sub light emitting unit) and a second stage SET2 (or a second stack or a second sub light emitting unit) sequentially connected between the first and second power lines PL1 and PL2. The light emitting unit EMU may include the first, second, third, and fourth electrodes EL1, EL2, EL3, and EL4, and each of the first and second stages SET1 and SET2 may include light emitting elements LD electrically connected in parallel in the same direction between two electrodes of the electrodes EL1, EL2, EL3, and EL4.

The first stage SET1 may include a first electrode EL1 and a second electrode EL2 (or a first sub-intermediate electrode CTE-1) and may include at least one first light emitting device LD1 electrically connected between the first electrode EL1 and the second electrode EL2 (or the first sub-intermediate electrode CTE-1). The first stage SET1 may include the reverse light emitting element LDr electrically connected in the direction opposite to the first light emitting element LD1 between the first electrode EL1 and the second electrode EL2 (or the first sub-intermediate electrode CTE-1).

The second stage SET2 may include a fourth electrode EL4 (or a second sub-intermediate electrode CTE-2) and may include at least one second light emitting element LD2 electrically connected between the fourth electrode EL4 (or the second sub-intermediate electrode CTE-2) and the third electrode EL3. The second stage SET2 may include the reverse light emitting element LDr electrically connected in the direction opposite to the second light emitting element LD2 between the fourth electrode EL4 (or the second sub-intermediate electrode CTE-2) and the third electrode EL3.

The first sub-intermediate electrode CTE-1 of the first stage SET1 and the second sub-intermediate electrode CTE-2 of the second stage SET2 may be integral with each other or connected to each other. For example, the first sub-intermediate electrode CTE-1 and the second sub-intermediate electrode CTE-2 may form the intermediate electrode CTE electrically connecting the continuous first stage SET1 and the second stage SET2. In case that the first sub-intermediate electrode CTE-1 and the second sub-intermediate electrode CTE-2 are provided integrally, the first sub-intermediate electrode CTE-1 and the second sub-intermediate electrode CTE-2 may be different parts of the intermediate electrode CTE.

In the above-described embodiment, the first electrode EL1 may be an anode electrode of the light emitting unit EMU of each pixel PXL, and the third electrode EL3 may be a cathode electrode of the light emitting unit EMU.

As described above, the light emitting unit EMU of the pixel PXL including the light emitting elements LD electrically connected in a series/parallel hybrid structure may easily adjust a driving current/voltage condition according to an applied product specification.

In particular, the light emitting unit EMU of the pixel PXL including the light emitting elements LD electrically connected in a series/parallel hybrid structure may reduce the driving current compared to the light emitting unit EMU having a structure in which the light emitting elements LD are electrically connected only in parallel.

As described with reference to FIG. 4, the pixel PXL may include stages (e.g., first and second stages SET1 and SET2) connected in series as the light emitting unit EMU. Therefore, the driving current of the pixel PXL may be reduced.

In FIG. 4, the pixel PXL (or the light emitting unit EMU) is illustrated as including two stages (i.e., first and second stages SET1 and SET2), but is not limited thereto. For example, the pixel PXL may include three or more stages.

Figure 5:
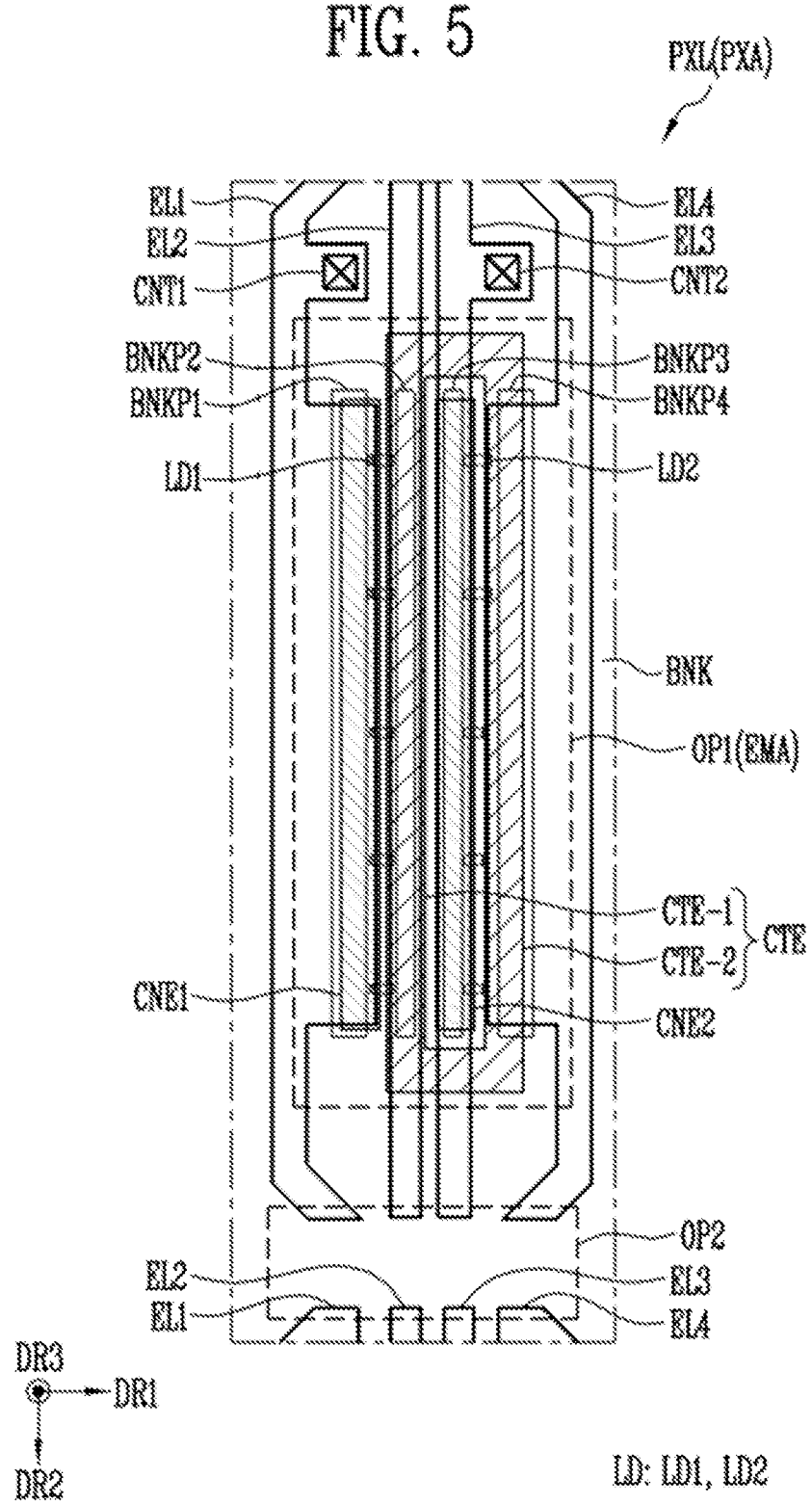
FIG. 5 is a schematic plan view illustrating an example of the pixel of FIG. 4.

FIG. 5 is a schematic plan view illustrating an example of the pixel of FIG. 4. In FIG. 5, for the sake of convenience, transistors connected to the light emitting elements LD and signal lines connected to the transistors are omitted, and the pixel PXL is schematically illustrated focused on the light emitting unit EMU described with reference to FIG. 4.

Referring to FIGS. 1 to 5, the pixel PXL may be formed in a pixel area PXA defined on a substrate. The pixel area PXA may include a light emitting area EMA. According to an embodiment, the pixel PXL may include a bank BNK and may be defined by a bank BNK surrounding the light emitting area EMA. As shown in FIG. 5, the bank BNK may include a first opening OP1 and a second opening OP2 exposing a configuration thereunder, and the light emitting area EMA may be defined by the first opening OP1 of the bank BNK. The second opening OP2 may be spaced apart from the first opening OP1 within the pixel area PXA and may be disposed adjacent to a side (e.g., a lower side or upper side) of the pixel area PXA.

The pixel PXL may include a first electrode EL1, a second electrode EL2, a third electrode EL3, and a fourth electrode EL4 physically separated or spaced apart from each other. The first electrode EL1, the second electrode EL2, the third electrode EL3 and the fourth electrode EL4 may correspond to the first electrode EL1, the second electrode EL2, the third electrode EL3 and the fourth electrode EL4 described with reference to FIG. 4, respectively.

The first electrode EL1, the second electrode EL2, the third electrode EL3, and the fourth electrode EL4 may be sequentially arranged in the first direction DR1. Each of the first electrode EL1, the second electrode EL2, the third electrode EL3, and the fourth electrode EL4 may extend in the second direction DR2 crossing the first direction DR1. Ends of the first electrode EL1, the second electrode EL2, the third electrode EL3, and the fourth electrode EL4 may be disposed in the second opening OP2 of the bank BNK. For reference, the first electrode EL1, the second electrode EL2, the third electrode EL3, and the fourth electrode EL4 may extend to adjacent pixel areas before the light emitting elements LD are supplied on the substrate in the manufacturing process of the display device and may be separated from other electrodes (e.g., electrodes of adjacent pixels adjacent to each other in the second direction DR2) at the second opening OP2 after the light emitting elements LD are supplied and aligned in the pixel area PXA. For example, the second opening OP2 of the bank BNK may be provided for a separation process for the first electrode EL1, the second electrode EL2, the third electrode EL3, and the fourth electrode EL4.

The first electrode EL1 may include a protrusion protruding toward the second electrode EL2 in the first direction DR1 in the light emitting area EMA. The protrusion of the first electrode EL1 may be provided to maintain a gap between the first electrode EL1 and the second electrode EL2 at a predetermined gap in the light emitting area EMA. Similarly, the fourth electrode EL4 may include a protrusion protruding toward the third electrode EL3 in the direction opposite to the first direction DR1 in the light emitting area EMA. The protrusion of the fourth electrode EL4 may be provided to maintain a gap between the third electrode EL3 and the fourth electrode EL4 at a predetermined gap in the light emitting area EMA.

However, the first electrode EL1, the second electrode EL2, the third electrode EL3, and the fourth electrode EL4 are not limited thereto. For example, the shape and/or mutual arrangement relationship of the first electrode EL1, the second electrode EL2, the third electrode EL3, and the fourth electrode EL4 may be variously changed. For example, each of the first electrode EL1 and the fourth electrode EL4 may not include a protrusion and may have a curved shape.

The first electrode EL1 may be electrically connected to the first transistor T1 described with reference to FIG. 4 through a first contact hole CNT1, and the third electrode EL3 may be electrically connected to the second power line PL2 described with reference to FIG. 4 through a second contact hole CNT2.

According to an embodiment, each of the first electrode EL1, the second electrode EL2, the third electrode EL3, and the fourth electrode EL4 may have a single layer or multilayer structure. For example, the first electrode EL1, the second electrode EL2, the third electrode EL3, and the fourth electrode EL4 may have a multilayer structure including a reflective electrode and a conductive capping layer. The reflective electrode may have a single layer or multilayer structure. For example, the reflective electrode may include at least one reflective conductive layer and may further selectively include at least one transparent conductive layer disposed on and/or under the reflective conductive layer.

According to an embodiment, the pixel PXL may include a first bank pattern BNKP1 overlapping a portion of the first electrode EL1, a second bank pattern BNKP2 overlapping a portion of the second electrode EL2, a third bank pattern BNKP3 overlapping a portion of the third electrode EL3, and a fourth bank pattern BNKP4 overlapping a portion of the fourth electrode EL4.

The first bank pattern BNKP1, the second bank pattern BNKP2, the third bank pattern BNKP3, and the fourth bank pattern BNKP4 may be disposed to be spaced apart from each other in the light emitting area EMA and may protrude upward a portion of each of the first electrode EL1, the second electrode EL2, the third electrode EL3, and the fourth electrode EL4. For example, the first electrode EL1 (or the protrusion of the first electrode EL1) may be disposed on the first bank pattern BNKP1 to be protruded in the third direction DR3 (i.e., in the thickness direction of the substrate SUB) by the first bank pattern BNKP1, the second electrode EL2 may be disposed on the second bank pattern BNKP2 to be protruded in the third direction DR3 by the second bank pattern BNKP2, the third electrode EL3 may be disposed on the third bank pattern BNKP3 to be protruded in the third direction DR3 by the third bank pattern BNKP3, and the fourth electrode EL4 (or the protrusion of the fourth electrode EL4) may be disposed on the fourth bank pattern BNKP4 to be protruded in the third direction DR3 by the fourth bank pattern BNKP4.

The pixel PXL may include a first light emitting element LD1 and a second light emitting element LD2. The pixel PXL may further include the reverse light emitting element LDr described with reference to FIG. 4.

The first light emitting element LD1 may be disposed between the first electrode EL1 and the second electrode EL2. A first end (or an end) of the first light emitting element LD1 may face the first electrode EL1, and a second end (or another end) of the first light emitting element LD1 may face the second electrode EL2. In case that first light emitting elements LD1 are provided, the first light emitting elements LD1 may be electrically connected in parallel between the first electrode EL1 and the second electrode EL2 and may form the first stage SET1 described with reference to FIG. 4.

Similarly, the second light emitting element LD2 may be disposed between the third electrode EL3 and the fourth electrode EL4. A first end of the second light emitting element LD2 may face the fourth electrode EL4, and a second end of the second light emitting element LD2 may face the third electrode EL3. The second end of the second light emitting element LD2 and the second end of the first light emitting element LD1 may include a semiconductor layer of the same type (e.g., a p-type semiconductor layer), and may be disposed to face each other with the second electrode EL2 and the third electrode EL3 interposed therebetween. In case that second light emitting elements LD2 are provided, the second light emitting elements LD2 may be connected in parallel between the third electrode EL3 and the fourth electrode EL4 and may constitute the second stage SET2 described with reference to FIG. 4.

In FIG. 5, the light emitting elements LD are shown as being aligned in a first direction DR1 between the first electrode EL1 and the second electrode EL2, and between the third electrode EL3 and the fourth electrode EL4, but an alignment direction of the light emitting elements LD is not limited thereto. For example, at least one of the light emitting elements LD may be arranged in a diagonal direction.

In an embodiment, the first end of the first light emitting element LD1 may be not directly disposed on the first electrode EL1 and may be electrically connected to the first electrode EL1 through at least one contact electrode, for example, a first contact electrode CNE1. Similarly, the second end of the second light emitting element LD2 may be not directly disposed on the third electrode EL3 and may be electrically connected to the third electrode EL3 through at least one contact electrode, for example, a second contact electrode CNE2. The disclosure, however, is not limited thereto. For example, the first end of the first light emitting element LD1 may directly contact the first electrode EL1 and may be electrically connected to the first electrode EL1.

According to an embodiment, each of the first light emitting element LD1 and the second light emitting element LD2 may have a micro-size and include a material having an inorganic crystal structure, for example, having a size as small as nanoscale to microscale. A more specific configuration of the light emitting element LD will be described below with reference to FIGS. 15 and 16.

According to an embodiment, the light emitting elements LD may be prepared in a form dispersed in a predetermined solution and may be supplied to the light emitting area EMA of the pixel area PXA through an inkjet printing method or a slit coating method. For example, the light emitting elements LD may be mixed with a volatile solvent and supplied to the light emitting area EMA. In this case, when a predetermined voltage is applied between the first electrode EL1 and the second electrode EL2 and between the third electrode EL3 and the fourth electrode EL4, an electric field is formed between the first electrode EL1 and the second electrode EL2 and between the third electrode EL3 and the fourth electrode EL4, and thus the light emitting elements LD may be self-aligned between the first electrode EL1, the second electrode EL2, the third electrode EL3, and the fourth electrode EL4. By volatilizing the solvent (or removing the solvent in any other way) after the light emitting elements LD are aligned, the light emitting elements LD may be stably arranged between the first electrode EL1 and the second electrode EL2, and between the third electrode EL3 and the fourth electrodes EL4.

According to embodiments, the pixel PXL may include a first contact electrode CNE1, a second contact electrode CNE2, and an intermediate electrode CTE.

The first contact electrode CNE1 may be formed on the first end of the first light emitting element LD1 and at least a portion of the first electrode EL1 corresponding thereto and may physically and/or electrically connect the first end of the first light emitting element LD1 to the first electrode EL1.

The second contact electrode CNE2 may be formed on the second end of the second light emitting device LD2 and at least a portion of the third electrode EL3 corresponding thereto and may physically and/or electrically connect the second end of the second light emitting element LD2 to the third electrode EL3.

The intermediate electrode CTE may include a first sub-intermediate electrode CTE-1 (or a first intermediate electrode) and a second sub-intermediate electrode CTE-2 (or a second intermediate electrode) extending in the second direction DR2. The first sub-intermediate electrode CTE-1 may be formed on the second end of the first light emitting element LD1 and at least a portion of the second electrode EL2 corresponding thereto. The intermediate electrode CTE may extend from the first sub-intermediate electrode CTE-1 to bypass the second contact electrode CNE2 or the second light emitting element LD2, and the second sub-intermediate electrode CTE-2 may be formed on the first end of the second light emitting element LD2 and at least a portion of the fourth electrode EL4 corresponding thereto. The intermediate electrode CTE may electrically connect the second end of the first light emitting element LD1 and the first end of the second light emitting element LD2.

As shown in FIG. 5, the intermediate electrode CTE may be spaced apart from the second contact electrode CNE2 and may have a closed loop shape surrounding the second contact electrode CNE2. Accordingly, the second light emitting element LD2 may be electrically connected in series to the first light emitting element LD1 through the intermediate electrode CTE.

As described with reference to FIG. 5, the first and second light emitting elements LD1 and LD2 may be disposed between the first to fourth electrodes EL1, EL2, EL3, and EL4, and the first light emitting element LD1 and the second light emitting element LD2 may be electrically connected in series through the intermediate electrode CTE. In this way, the light emitting unit EMU of the pixel PXL may be configured by connecting the first and second light emitting elements LD1 and LD2 aligned in the pixel area PXA of the pixel PXL in a series structure.

Figure 6:
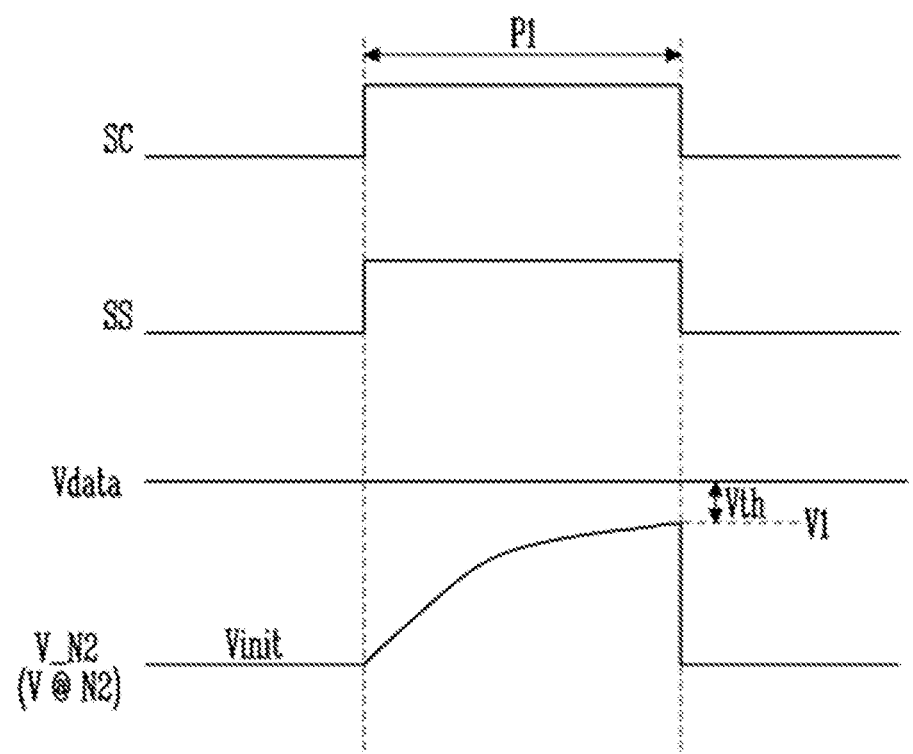
FIG. 6 is a schematic waveform diagram illustrating an example of signals measured in the pixel of FIG. 4.

FIG. 6 is a schematic waveform diagram illustrating an example of signals measured in the pixel of FIG. 4. FIG. 6 illustrates signals for explaining the operation of the pixel PXL during the test period. During the test period, a sensing voltage corresponding to the threshold voltage of the first transistor T1 of the pixel PXL may be sensed.

Referring to FIGS. 1 to 6, in a first period P1, a scan signal SC applied to the i-th scan line SLi may have a pulse of a gate-on voltage level.

In this case, in the first period P1, the second transistor T2 may be turned on in response to the scan signal SC of the gate-on voltage level, and the j-th data line DLj may be electrically connected to the first node N1.

In case that a data signal Vdata (or a test voltage) is applied to the j-th data line DLj, the data signal Vdata may be applied to the first node N1. Here, the data signal Vdata may have a voltage level for sensing the threshold voltage Vth of the first transistor T1.

In an embodiment, the data signal Vdata may be set to be greater than the reference voltage, and the reference voltage may have a voltage level equal to a voltage difference between the total operating voltage of the series connection of the first stage SET1 (or the first light emitting element LD1) and the second stage SET2 (or the second light emitting element LD2), and the operating voltage of one of the first stage SET1 and the second stage SET2. Here, the operating voltage may be a voltage required for the light emitting element LD to emit light, and for example, the operating voltage may be the threshold voltage of the light emitting element LD. The data signal Vdata may have a voltage level less than or equal to the total operating voltage of the first stage SET1 (or the first light emitting element LD1) and the second stage SET2 (or the second light emitting element LD2).

For example, in case that the operating voltage of each of the first light emitting element LD1 and the second light emitting element LD2 is about 2.5V, the data signal Vdata may have a voltage level of about 4V, which is less than about 5V (i.e., 2.5V×2) and greater than about 2.5V (i.e., 5V−2.5V), with respect to the second power voltage VSS.

Similar to the scan signal SC, in the first period P1, the sensing scan signal SS applied to the i-th sensing scan line SSLi may have a pulse of a gate-on voltage level. The waveform and phase of the sensing scan signal SS may be substantially identical to the waveform and phase of the scan signal SC.

In this case, in the first period P1, the third transistor T3 may be turned on in response to the sensing scan signal SS of the gate-on voltage level, and the j-th sensing line RLj and the second node N2 may be electrically connected.

In case that the initialization voltage Vinit is applied to the j-th sensing line RLj at a start point of the first period P1, the initialization voltage Vinit may be applied to the second node N2. Accordingly, a node voltage V_N2 of the second node N2 at the start point of the first period P1 may have a voltage level of the initialization voltage Vinit. For example, the initialization voltage Vinit may have a voltage level of about 2V.

Thereafter, the supply of the initialization voltage Vinit may be cut off until an end point of the first period P1.

In this case, the first transistor T1 may supply a current corresponding to a gate-source voltage to the second node N2, and accordingly, the node voltage V_N2 of the second node N2 may rise linearly to a specific voltage level (e.g., the first voltage level V1). For example, the node voltage V_N2 of the second node N2 may rise to the first voltage level V1 corresponding to a difference (i.e., Vdata−Vth) between the data signal Vdata and the threshold voltage Vth of the first transistor T1.

Accordingly, the test device 20 (see FIG. 1) may sense the threshold voltage Vth (or the node voltage V_N2) of the first transistor T1 through the j-th sensing line RLj.

In embodiments, in case that the first voltage level V1 (or the sensing voltage) measured in the first period P1 is within the reference range, the test device 20 may determine that the light emitting element LD in the pixel PXL (i.e., the first and second light emitting elements LD1 and LD2, or the first and second stages SET1 and SET2) are normally (or validly) aligned. For example, the reference range may be less than the total operating voltage of the first stage SET1 (or the first light emitting element LD1) and the second stage SET2 (or the second light emitting element LD2) and may be greater than the reference voltage (i.e., the voltage difference between the total operating voltage of the first and second stages SET1 and SET2 and the operating voltage of the light emitting element LD). In other words, the reference range may be less than the product of the total number of the stages (SET1 and SET2) and the operation voltage of the light emitting element LD, and may be greater than the product of the number of the stages (SET1 and SET2) excluding one stage (i.e., the total number−1) and the operating voltage of the light emitting element LD.

For example, in case that there are two stages SET1 and SET2 and the operating voltage of the light emitting element LD is about 2.5V, the reference range may be less than about 5V and greater than about 2.5V. In case that the first voltage level V1 is about 3V, the first voltage level V1 is within the reference range, and thus the test device 20 may determine that the light emitting elements LD in the pixel PXL are validly aligned.

Figure 7:
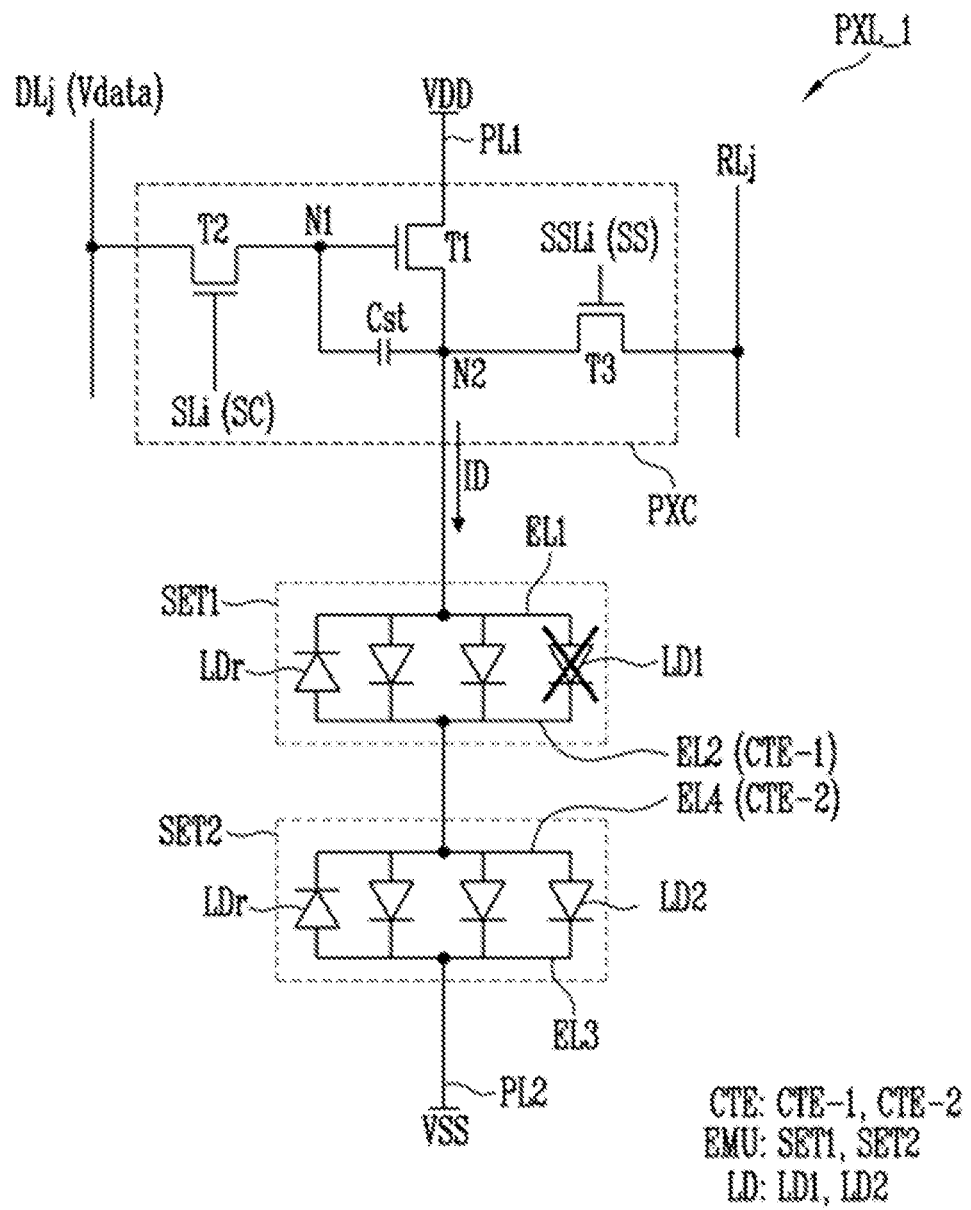
FIG. 7 is a schematic circuit diagram illustrating another example of a pixel included in the display panel of FIG. 1.
Figure 8:
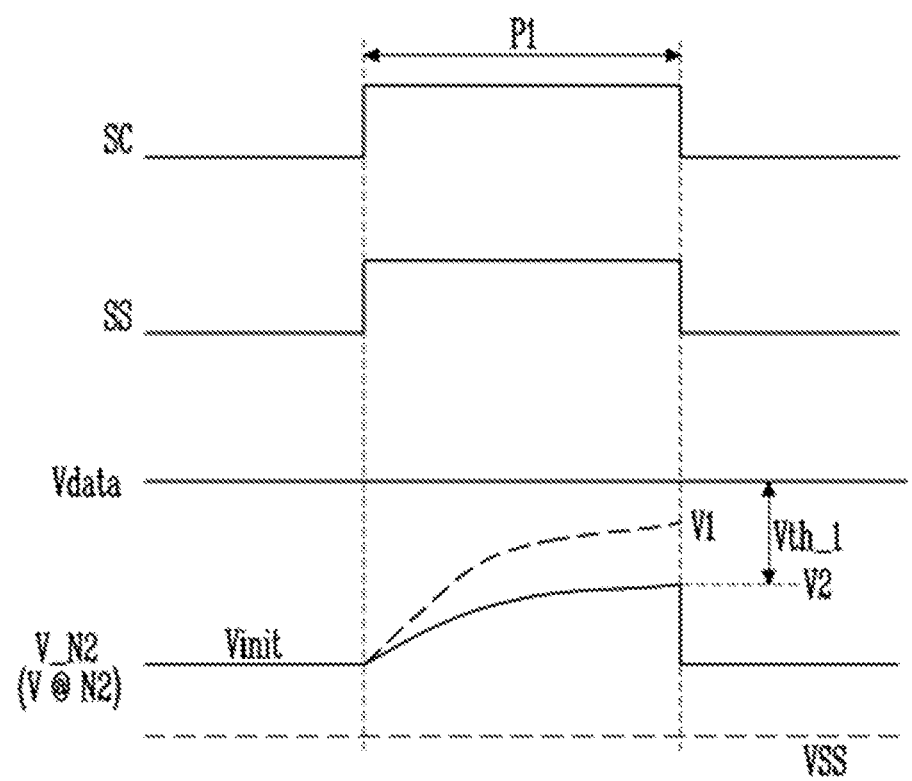
FIG. 8 is a schematic waveform diagram illustrating an example of signals measured in the pixel of FIG. 7.

FIGS. 7 and 8 illustrate a case where it is determined that the light emitting elements LD in the pixel PXL are invalidly aligned.

FIG. 7 is a schematical circuit diagram illustrating another example of a pixel included in the display panel of FIG. 1. FIG. 7 illustrates a circuit diagram corresponding to FIG. 4. FIG. 8 is a schematic waveform diagram illustrating an example of signals measured in the pixel of FIG. 7. In FIG. 8, a waveform diagram corresponding to FIG. 6 is shown.

First, referring to FIGS. 4 and 7, the pixel PXL_1 of FIG. 7 may be substantially identical or similar to the pixel PXL of FIG. 4 except that the first light emitting element LD1 has a defect. Therefore, repetitive descriptions will be omitted. The defect of the first light emitting element LD1 is an example, and as another example, there may be a defect in the second light emitting element LD2 instead of the first light emitting element LD1.

For example, the first electrode EL1 and the second electrode EL2 may be shorted by the first light emitting element LD1 having the defect shown in FIG. 7. In this case, the driving current flowing between the first electrode EL1 and the second electrode EL2 may flow through a defected first light emitting element LD1 (e.g., a short-circuited light emitting element), and the driving current may not flow through other first light emitting elements LD1 requiring the operating voltage.

For reference, in case that the first light emitting element LD1 is electrically disconnected, the driving current may not flow only to the corresponding first light emitting element LD1 and flow through other first light emitting element LD1. Therefore, display quality may hardly be deteriorated. As the number of the first light emitting elements LD1 increases, disconnection of a first light emitting element LD1 may hardly affect the first stage SET1. In contrast, in case that the first light emitting element LD1 is shorted, the first stage SET1 may not operate (or emit light), and the luminance of the pixel PXL may be greatly reduced (e.g., at about a level of ½). In case that the same data signal Vdata is applied to the pixel PXL of FIG. 4 and the pixel PXL_1 of FIG. 7, the pixel PXL_1 of FIG. 7 may emit light with lower luminance than that of the pixel PXL of FIG. 4. In case that the display unit 110 (see FIG. 1) includes pixels PXL_1 (i.e., defective pixels PXL_1) of FIG. 5, luminance deviation may occur and display quality may be deteriorated.

It is difficult to accurately determine whether a defect has occurred in each pixel PXL_1 or to detect the defective pixel PXL_1 by an optical imaging method for measuring the luminance of a specific area of the display unit 110 (see FIG. 1) or by a method for sensing a current flowing through the display unit 110 (or a pixel PXL_1). In particular, it is difficult to determine whether a defect has occurred in each pixel PXL_1 by a conventional test method for determining whether there is a defect in the light emitting element LD based on whether or not the pixels PXL_1 which are turned on at the same time emits light.

The test method of the display panel according to embodiments of the disclosure may detect whether the defect (in particular, a short circuit having a large influence on a change of the luminance) has occurred in the pixel PXL_1 based on the sensed threshold voltage Vth of the first transistor T1 (or the driving transistor).

Referring to FIGS. 6 to 8, the scan signal SC, the sensing scan signal SS, and the data signal Vdata shown in FIG. 8 may be substantially identical or similar to the scan signal SC, the sensing scan signal SS, and the data signal Vdata, described with reference to FIG. 6, respectively. Therefore, repetitive descriptions will be omitted.

The initialization voltage Vinit may be applied to the j-th sensing line RLj at the start point of the first period P1, and thereafter, the supply of the initialization voltage Vinit may be cut off until the end point of the first period P1.

In this case, the first transistor T1 may supply a current corresponding to the gate-source voltage to the second node N2, and accordingly, the node voltage V_N2 of the second node N2 may increase linearly. However, in case that the defect has occurred in the first light emitting element LD1, the node voltage V_N2 of the second node N2 may increase only to the second voltage level V2 lower than the first voltage level V1. This is because a current flows or leaks through the second light emitting element LD2 in case that the node voltage V_N2 of the second node N2 is greater than the operation voltage of the second light emitting element LD2 (or the second stage SET2) with respect to the second power voltage VSS as the first electrode EL1 and the second electrode EL2 shown in FIG. 5 are shorted. Accordingly, the second voltage level V2 may be equal or similar to the operating voltage of the second light emitting element LD2 with respect to the second power voltage VSS, and for example the second voltage level V2 may be about 2.5V.

In case that the second voltage level V2 measured in the first period P1 is out of the reference range (i.e., the reference range described with reference to FIG. 6) (or in case that the second voltage level V2 is less than or equal to the reference voltage described with reference to FIG. 6), the test device may determine that the light emitting elements LD (i.e., the first and second light emitting elements LD1 and LD2, or the first and second stages SET1 and SET2) in the pixel PXL_1, are invalidly aligned. For example, in case that the second voltage level V2 is about 2.5V and the reference range is greater than 2.5V and less than 5V, the second voltage level V2 is out of the reference range, and thus the test device 20 may determine that the light emitting elements LD are invalidly aligned in the pixel PXL_1.

For another example, in case that the defect (i.e., a short circuit) occurs in both the first light emitting element LD1 and the second light emitting element LD2, the first electrode EL1, the second electrode EL2, the third electrode EL3, and the fourth electrode EL4 shown in FIG. 7, may be shorted, and the node voltage V_N2 of the second node N2 may be equal to a voltage level of the second power voltage VSS. Accordingly, an inactive pixel PXL_1 that has not a partial defect but an entire defect, may be detected.

A repair operation may be performed on the pixels PXL_1 including the light emitting elements LD which are invalidly aligned.

For example, the repair operation for the first light emitting element LD1 may be performed by cutting the disconnected first light emitting element LD1 or a connection portion thereof shown in FIG. 5 by using a laser or the like.

On the other hand, it may be described that the test device 20 determines whether the pixel PXL_1 (or the pixel PXL) has the defect based on whether or not the second voltage level V2 (or the first voltage level V1) is within the reference range, but the disclosure is not limited thereto. For example, the sensing unit 140 may determine whether the pixel PXL_1 (or the pixel PXL) has the defect based on whether or not the sensed threshold voltage Vth_1 of the first transistor T1 of the pixel PXL_1 is within a normal range.

As described with reference to FIGS. 6 to 8, the test device 20 (or the test method of the display device) may determine whether the pixel (PXL or PXL_1) has the defect (in particular, a short circuit having a large influence on the change of the luminance or a light emitting element LD aligned invalidly) based on a voltage level (V1 or V2) sensed at the second node N2 to which the first transistor T1 and the light emitting unit EMU are connected (or the sensed threshold voltage (Vth or Vth_1) of the first transistor T1).

Figure 9:
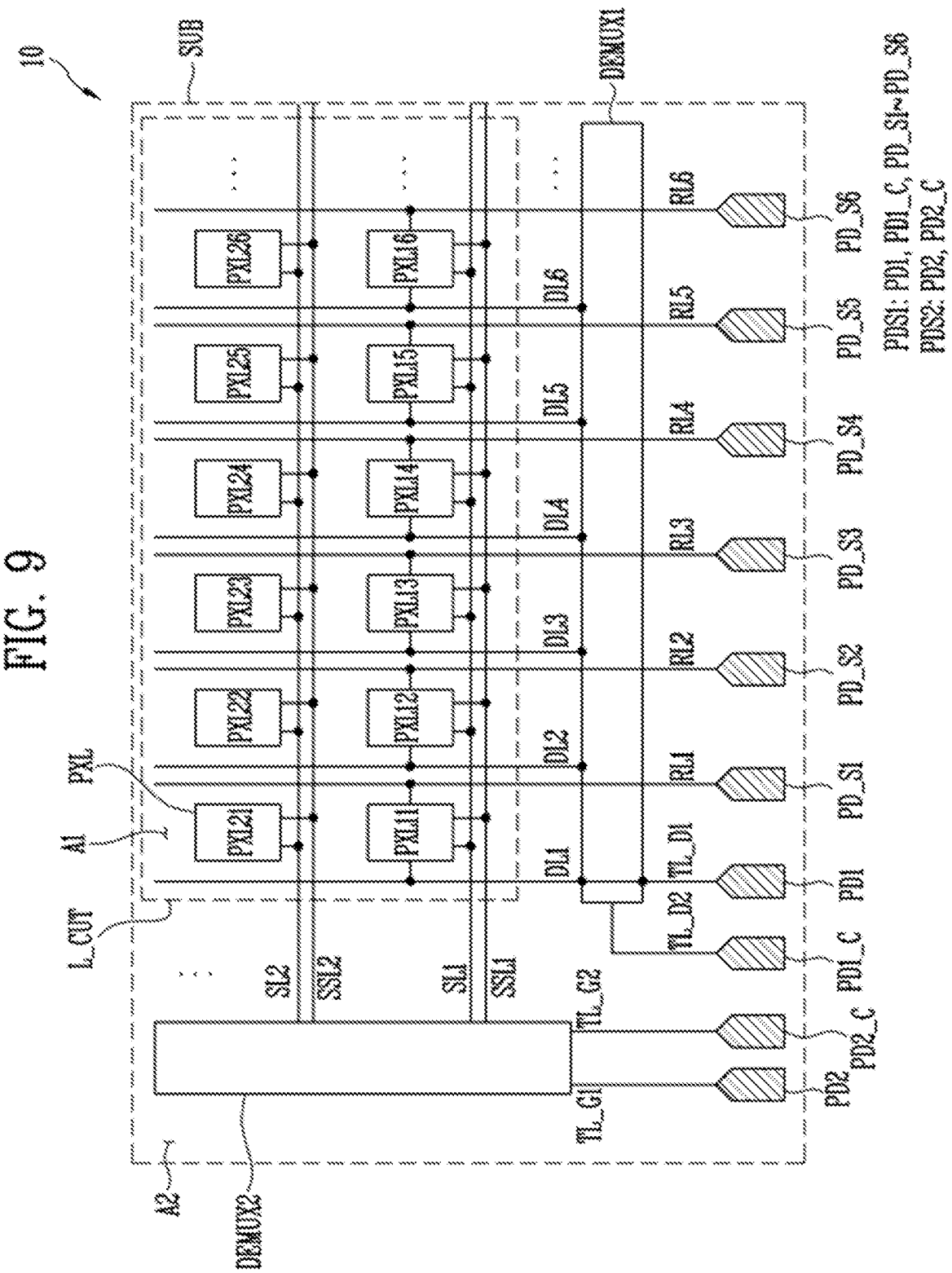
FIG. 9 is a schematic diagram illustrating an example of an enlarged portion of the display panel of FIG. 1.
Figure 10:
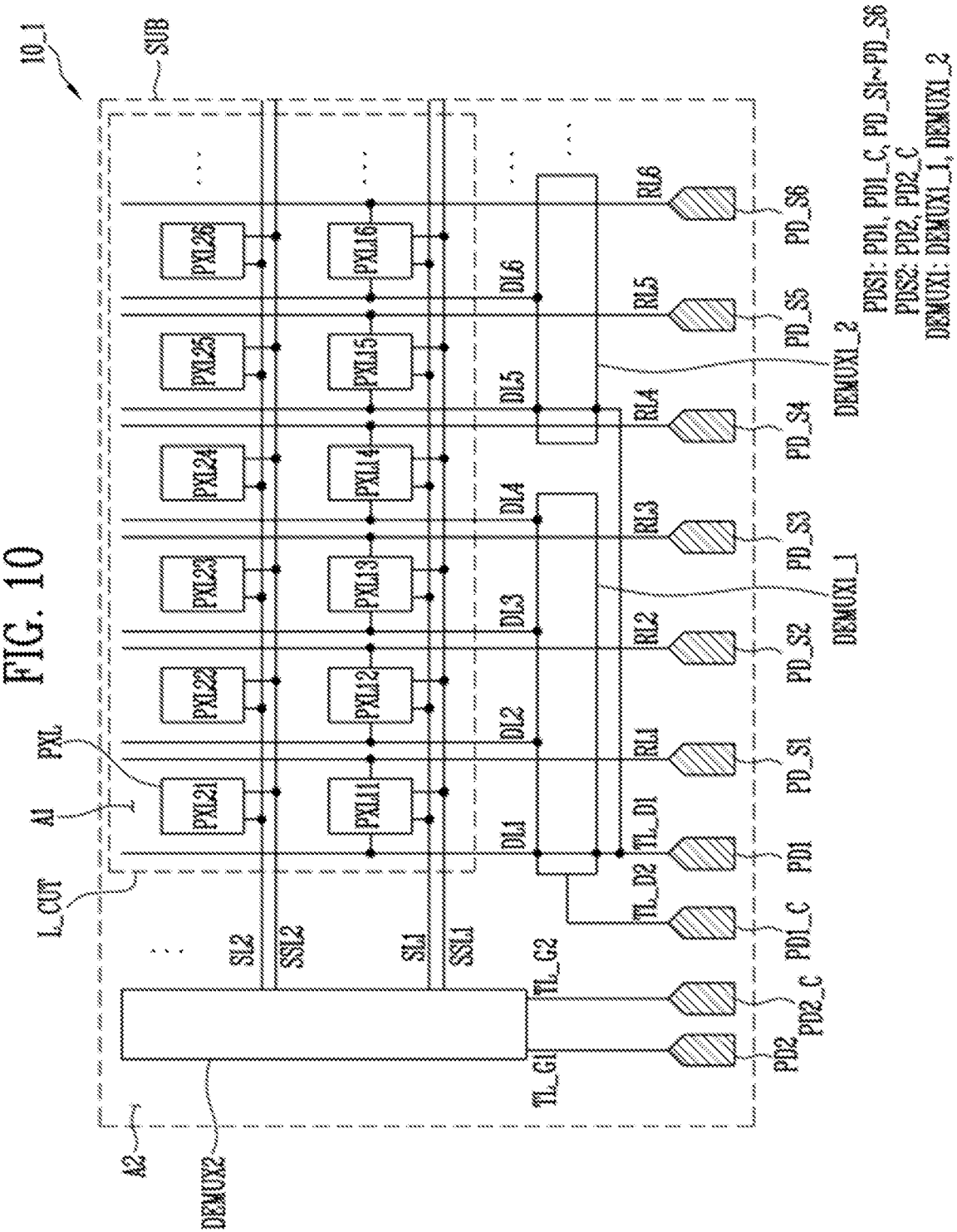
FIGS. 10 and 11 are schematic diagrams illustrating another example of an enlarged portion of the display panel of FIG. 1.
Figure 11:
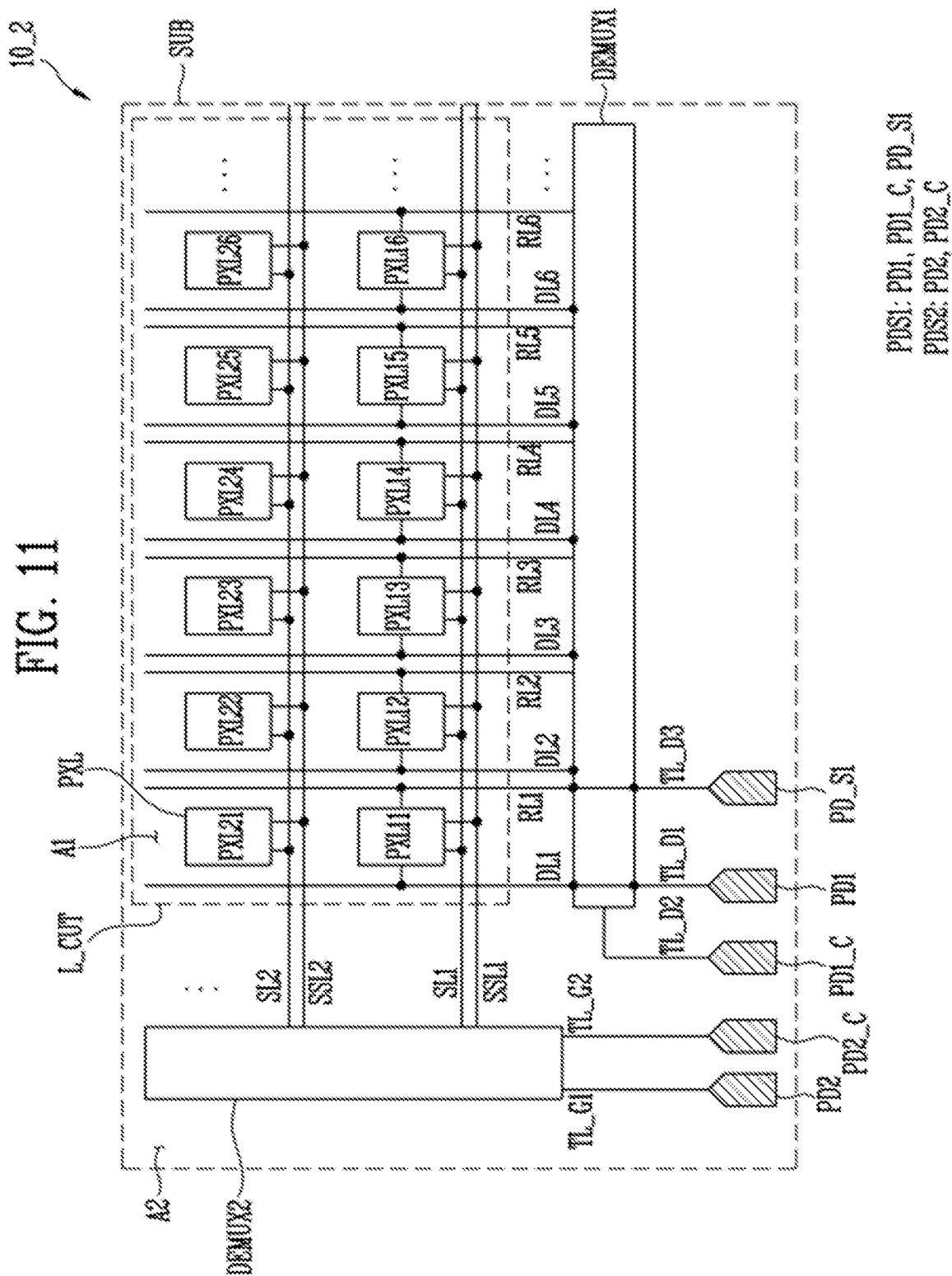

FIG. 9 is a schematic diagram illustrating an example of an enlarged portion of the display panel of FIG. 1. In FIG. 9, only a portion of the display panel 10 corresponding to two rows and six columns is illustrated as an example. FIGS. 10 and 11 are schematic diagrams illustrating another example of an enlarged portion of the display panel of FIG. 1.

First, referring to FIGS. 1 and 9, the display panel 10 may include a substrate SUB, scan lines SL1 and SL2, sensing scan lines SSL1 and SSL2, data lines DL1, DL2, DL3, DL4, DL5, and DL6, sensing lines RL1, RL2, RL3, RL4, RL5, and RL6, pixels PXL11, PXL12, PXL13, PXL14, PXL15, PXL16, PXL21, PXL22, PXL23, PXL24, PXL25, and PXL26, first pads PDS1, second pads PDS2, a first demultiplexer DEMUX1, and a second demultiplexer DEMUX2.

Since each of the pixels PXL11 to PXL16 and PXL21 to PXL26 is substantially identical or similar to the pixel PXL described with reference to FIGS. 1 to 4 (or the pixel PXL_1 described with reference to FIG. 7), repetitive descriptions will be omitted.

As described with reference to FIG. 1, the first pads PDS1, the second pads PDS2, the first demultiplexer DEMUX1, and the second demultiplexer DEMUX2 may be disposed or provided in a second area A2 of the substrate SUB, and configurations provided in the second area A2 and the second area A2 of the substrate SUB by a cutting process along the cutting line L_CUT may be removed.

The first pads PDS1 may include a first pad PD1, a first control pad PD1_C, and sensing pads PD_S1, PD_S2, PD_S3, PD_S4, PD_S5, and PD_S6.

The first pad PD1 may receive a test voltage from the external (e.g., the test device 20 (see FIG. 1)). The first pad PD1 may be electrically connected to the first demultiplexer DEMUX1 through the first test line TL_D1. The first test line TL_D1 may be included in the first test lines TL1_1 to TL1_k described with reference to FIG.

The first control pad PD1_C may receive a first demux control signal for controlling the first demultiplexer DEMUX1 from the external. The first control pad PD1_C may be electrically connected to the first demultiplexer DEMUX1 through the second test line TL_D2. The second test line TL_D2 may be included in the first test lines TL1_1 to TL1_k described with reference to FIG. 1. According to an embodiment, the first control pad PD1_C may include sub-control pads according to the number of the first demux control signals required to control the operation of the first demultiplexer DEMUX1.

The sensing pads PD_S1 to PD_S6 may be electrically connected to the sensing lines RL1 to RL6, respectively, and may transfer sensing signals, which are output through the sensing lines RL1 to RL6 from the pixels PXL11 to PXL16 and PXL21 to PXL26, to another component or an external component (e.g., the test device 20 (see FIG. 1)).

The second pads PDS2 may include a second pad PD2 and a second control pad PD2_C.

The second pad PD2 may receive a gate signal (or a scan signal) from an external component (e.g., the test device 20 (see FIG. 1)). The second pad PD2 may be electrically connected to the second demultiplexer DEMUX2 through the first gate test line TL_G1.

The second control pad PD2_C may receive a second demux control signal for controlling the second demultiplexer DEMUX2 from an external component. The second control pad PD2_C may be electrically connected to the second demultiplexer DEMUX2 through the second gate test line TL_G2.

According to an embodiment, the second control pad PD2_C may include sub-control pads according to the number of the second demux control signals required to control the operation of the second demultiplexer DEMUX2. For example, in case that the second demultiplexer DEMUX2 is implemented as a shift register that sequentially shifts and outputs a gate signal, the second demux control signal may include clock signals, a gate-on voltage, and a gate-off voltage, and the second control pad PD2_C may include sub-control pads receiving each of clock signals, a gate-on voltage, and a gate-off voltage.

The first demultiplexer DEMUX1 may be electrically connected to the data lines DL1 to DL6. The first demultiplexer DEMUX1 may selectively connect the first pad PD1 to one of the data lines DL1 to DL6 in response to the first demux control signal provided through the first control pad PD1_C (or the second test line TL_D2) and may transfer a test voltage applied to the first pad PD1 to the selected one of the data lines DL1 to DL6. For example, the first demultiplexer DEMUX1 may include switches that are electrically connected between the data lines DL1 to DL6 and the first pad PD1 (or the first test line TL_D1) and are selectively turned on in response to the first demux control signal.

The second demultiplexer DEMUX2 may be electrically connected to the scan lines SL1 and SL2 and the sensing scan lines SSL1 and SSL2. The second demultiplexer DEMUX2 may selectively connect the second pad PD2 to one of the scan lines SL1 and SL2 and one of the sensing scan lines SSL1 and SSL2, or may select one of the scan lines SL1 and SL2 and one of the sensing scan lines SSL1 and SSL2 to provide a gate signal in response to the second demux control signal provided through the second control pad PD2_C (or the second gate test line TL_G2).

As described below, the same gate signal may be applied to the scan lines SL1 and SL2 and the sensing scan lines SSL1 and SSL2 corresponding thereto during the test period. Accordingly, one (e.g., the first scan line SL1) of the scan lines SL1 and SL2 and one (e.g., the first sensing scan line SSL1) of the sensing scan lines SSL1 and SSL2 corresponding thereto may be electrically connected to each other through the second demultiplexer DEMUX2 or directly in the second area A2.

In FIG. 9, the display panel 10 is illustrated as including a first demultiplexer DEMUX1, but the display panel 10 is not limited thereto.

As shown in FIG. 10, the display panel 10_1 (or the first demultiplexer DEMUX1) may include sub-demultiplexers DEMUX1_1 and DEMUX1_2. Each of the sub-demultiplexers DEMUX1_1 and DEMUX1_2 may be implemented as a 1:4 demultiplexer, but this is only an example, and each of the sub-demultiplexers DEMUX1_1 and DEMUX1_2 may have outputs of 3 or less or outputs of 5 or more (i.e., an input/output ratio of 1:5).

The first sub-demultiplexer DEMUX1_1 may be electrically connected to the first to fourth data lines DL1 to DL4 and may electrically connect one of the first to fourth data lines DL1 to DL4 to the first pad PD1 in response to the first demux control signal provided through the second test line TL_D2.

Similarly, the second sub-demultiplexer DEMUX1_2 may be electrically connected to other data lines (e.g., the fifth and sixth data lines DL5 to DL6) and may electrically connect one of the other data lines to the first pad PD1 in response to the first demux control signal. For example, the fifth data line DL5 may be electrically connected to the first pad PD1 through the second sub-demultiplexer DEMUX1_2, and at the same time, the first data line DL1 may be electrically connected to the first pad PD1 through the first sub-demultiplexer DEMUX1_1. In this case, a test voltage may be simultaneously applied to the first data line DL1 and the fifth data line DL5, and the pixels (e.g., the eleventh pixel PXL11) electrically connected to the first data line DL1 and the pixels (e.g., the fifteenth pixel PXL15) electrically connected to the fifth data line DL5 may be simultaneously tested. Accordingly, the total test time for the display panel 10_1 may be relatively reduced.

In FIGS. 9 and 10, the sensing lines RL1 to RL6 are shown to be directly connected to the sensing pads PD_S1 to PD_D6, respectively, but the disclosure is not limited thereto.

As shown in FIG. 11, in the display panel 10_2, the first demultiplexer DEMUX1 may be electrically connected to the sensing lines RL1 to RL6 and may be electrically connected to the first sensing pad PD_S1 through the third test line TL_D3. The third test line TL_D3 may be included in the first test lines TL1_1 to TL1_k described with reference to FIG. 1. The first demultiplexer DEMUX1 may select one of the sensing lines RL1 to RL6 and electrically connect it to the first sensing pad PD_S1 and may selectively output sensing signals, which are output through the sensing lines RL1 to RL6 from the pixels PXL11 to PXL16 and PXL21 to PXL26, to the first sensing pad PD_S1. For example, in case that the first demultiplexer DEMUX1 electrically connects the first data line DL1 to the first pad PD1, pixels (e.g., the eleventh pixel PXL11 and the twenty-first pixel PXL21) electrically connected to the first data line DL1 may be tested. Accordingly, the first demultiplexer DEMUX1 may select the first sensing line RL1 corresponding to the first data line DL1, may electrically connect it to the first sensing pad PD_S1, and may output sensing signals from the pixels to the external. Accordingly, the number of sensing pads (or the first pads PDS1) on the display panel 10_2 may be further reduced.

The operation of the display panel 10 of FIG. 9 (or the display panel 10_1 of FIG. 10, the display panel 10_2 of FIG. 11) or a test method thereof will be described with reference to FIG. 12.

Figure 12:
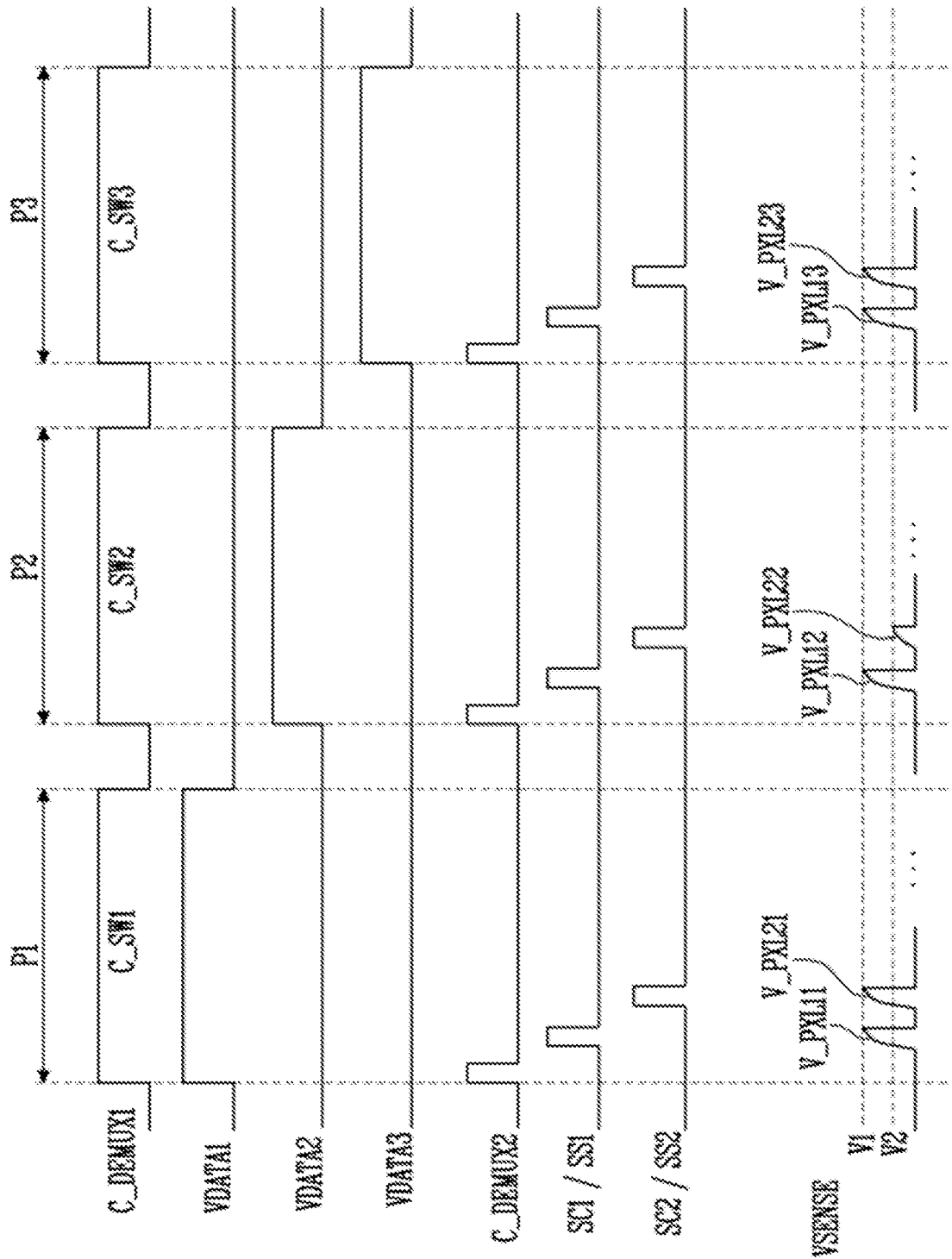
FIG. 12 is a schematic waveform diagram illustrating an example of signals measured in the display panel of FIG. 9.

FIG. 12 is a waveform diagram illustrating an example of signals measured in the display panel of FIG. 9.

Referring to FIGS. 1, 4, 6 to 8, and 9 to 12, in the first period P1, the first demux control signal C_DEMUX1 applied to the first control pad PD1_C may have a first switch control signal C_SW1 (or a first control value). In this case, the first demultiplexer DEMUX1 may electrically connect the first data line DL1 to the first pad PD1 in response to the first switch control signal C_SW1. The test voltage applied to the first pad PD1 may be provided to the first data line DL1, and the first data voltage VDATA1 of the first data line DL1 may have a voltage level (e.g., a logic high level) corresponding to the test voltage during the first period P1.

The second demux control signal C_DEMUX2 applied to the second control pad PD2_C in the first period P1 may have a pulse of a logic high level. In this case, the second demultiplexer DEMUX2 may sequentially provide a gate signal (or a scan signal and a sensing scan signal) to the scan lines SL1 and SL2 and the sensing scan lines SSL1 and SSL2 in response to the second demux control signal C_DEMUX2.

For example, as shown in FIG. 12, each of the first scan signal SC1 applied to the first scan line SL1 and the first sensing scan signal SS1 applied to the first sensing scan line SSL1 may have a gate-on voltage level. In this case, as described with reference to FIGS. 4 and 6 to 8, the first data voltage VDATA1 may be applied to the eleventh pixel PXL11, and the eleventh sensing signal V_PXL11 (or the eleventh sensing voltage) according to the first data voltage VDATA1 may be output from the eleventh pixel PXL11 through the first sensing line RL1 to the test device 20 (see FIG. 1) as a sensing signal VSENSE.

In case that the eleventh sensing signal V_PXL11 is within the reference range described with reference to FIGS. 4 and 6 (e.g., in case that it is greater than the reference voltage or the second voltage level V2, or less than the first voltage level V1), it may be determined that the light emitting elements LD (see FIG. 4) in the eleventh pixel PXL11 are validly aligned.

Thereafter, as shown in FIG. 12, each of the second scan signal SC2 applied to the second scan line SL2 and the second sensing scan signal SS2 applied to the second sensing scan line SSL2 may have a gate-on voltage level. In this case, as described with reference to FIGS. 4 and 6 to 8, the first data voltage VDATA1 may be applied to the twenty-first pixel PXL21, and the twenty-first sensing signal V_PXL21 (or the twenty-first sensing voltage) according to the first data voltage VDATA1 may be output from the twenty-first pixel PXL21 to the test device 20 (see FIG. 1) through the first sensing line RL1 as a sensing signal VSENSE.

In case that the twenty-first sensing signal V_PXL21 is within the reference range, it may be determined that the light emitting elements LD in the twenty-first pixel PXL21 are validly aligned.

Similar to the first period P1, in the second period P2, the first demux control signal C_DEMUX1 applied to the first control pad PD1_C may have the second switch control signal C_SW2 (or the second control value). In this case, the first demultiplexer DEMUX1 may electrically connect the second data line DL2 to the first pad PD1 in response to the second switch control signal C_SW2. The test voltage applied to the first pad PD1 may be provided to the second data line DL2, and the second data voltage VDATA2 of the second data line DL2 may have a voltage level (e.g., a logic high level) corresponding to the test voltage during the second period P2.

The second demux control signal C_DEMUX2 applied to the second control pad PD2_C in the second period P2 may have a pulse of a logic high level. In this case, the second demultiplexer DEMUX2 may sequentially provide a gate signal (or a scan signal and a sensing scan signal) to the scan lines SL1 and SL2 and the sensing scan lines SSL1 and SSL2 in response to the second demux control signal C_DEMUX2.

For example, as shown in FIG. 12, each of the first scan signal SC1 applied to the first scan line SL1 and the first sensing scan signal SS1 applied to the first sensing scan line SSL1 may have a gate-on voltage level. In this case, as described with reference to FIGS. 4 and 6 to 8, the second data voltage VDATA2 may be applied to the twelfth pixel PXL12, and the twelfth sensing signal V_PXL12 (or the twelfth sensing voltage) according to the second data voltage VDATA2 may be output from the twelfth pixel PXL12 to the test device 20 (see FIG. 1) through the second sensing line RL2 as a sensing signal VSENSE.

In case that the twelfth sensing signal V_PXL12 is within the reference range described with reference to FIGS. 4 and 6, it may be determined that the light emitting elements LD in the twelfth pixel PXL12 are validly aligned.

Thereafter, as shown in FIG. 12, each of the second scan signal SC2 applied to the second scan line SL2 and the second sensing scan signal SS2 applied to the second sensing scan line SSL2 may have a gate-on voltage level. In this case, as described with reference to FIGS. 4 and 6 to 8, the first data voltage VDATA2 may be applied to the twenty-second pixel PXL22, and the twenty-second sensing signal V_PXL22 (or the twenty-second sensing voltage) according to the second data voltage VDATA2 may be output from the twenty-second pixel PXL22 to the test device 20 (see FIG. 1) through the second sensing line RL2 as a sensing signal VSENSE.

In case that the twenty-first sensing signal V_PXL21 is out of the reference range (e.g., it is less than or equal to the second voltage level V2), it may be determined that the light emitting elements LD in the twenty-second pixel PXL22 are invalidly aligned.

Similar to the first period P1, in the third period P3, the first demux control signal C_DEMUX1 applied to the first control pad PD1_C may have a third switch control signal C_SW3 (or the third control value). In this case, the first demultiplexer DEMUX1 may electrically connect the third data line DL3 to the first pad PD1 in response to the third switch control signal C_SW3. The test voltage applied to the first pad PD1 may be provided to the third data line DL3, and the third data voltage VDATA3 of the third data line DL3 may have a voltage level (e.g., a logic high level) corresponding to the test voltage during the third period P3.

The second demux control signal C_DEMUX2 applied to the second control pad PD2_C in the third period P3 may have a pulse of a logic high level. In this case, the second demultiplexer DEMUX2 may sequentially provide a gate signal (or a scan signal and a sensing scan signal) to the scan lines SL1 and SL2 and the sensing scan lines SSL1 and SSL2 in response to the second demux control signal C_DEMUX2.

In this case, similar to the first period P1, the thirteenth sensing signal V_PXL13 and the twenty-third sensing signal V_PXL23 may be sequentially output from the thirteenth pixel PXL13 and the twenty-third pixel PXL23, and it may be determined whether the light emitting elements LD in the thirteenth pixel PXL13 and the twenty-third pixel PXL23 are validly aligned based on the thirteenth sensing signal V_PXL13 and the twenty-third sensing signal V_PXL23.

As described with reference to FIG. 12, the alignment state of the light emitting elements LD for each of the pixels PXL11 to PXL16 and PXL21 to PXL26 may be tested through the first demultiplexer DEMUX1 and the second demultiplexer DEMUX2.

Figure 13:
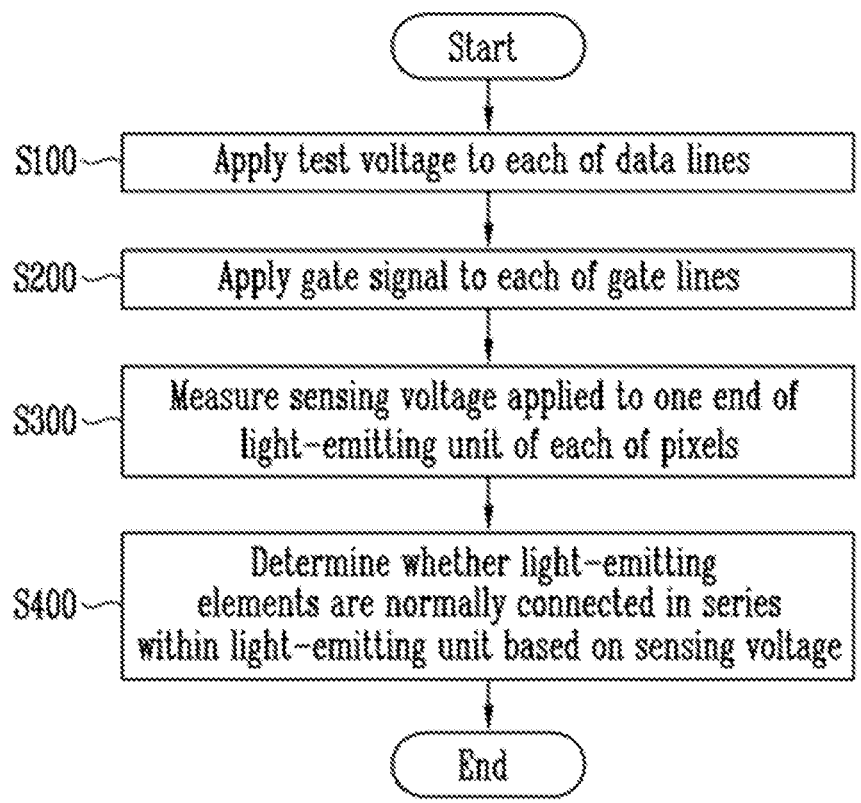
FIG. 13 is a schematic flowchart illustrating a test method of a display panel according to embodiments of the invention.
Figure 14:
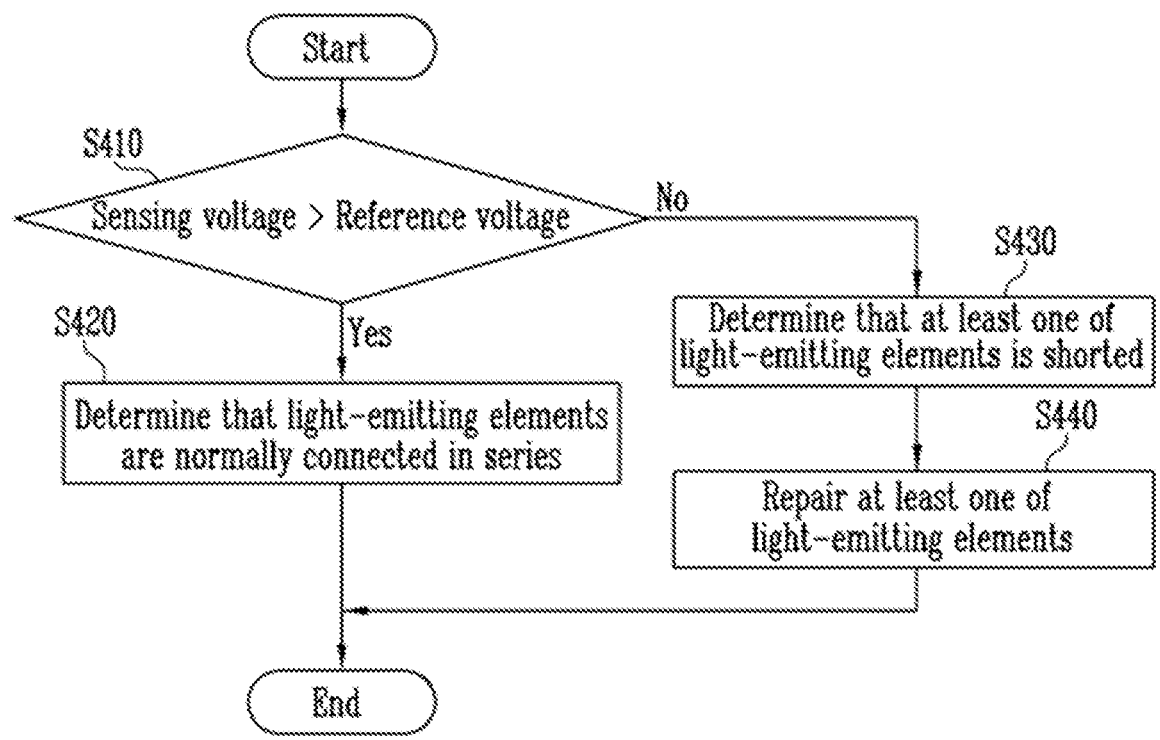
FIG. 14 is a schematic flowchart illustrating detailed processes of a step of determining an alignment state of light emitting elements by the method of FIG. 13.

FIG. 13 is a schematic flowchart illustrating a test method of a display panel according to embodiments of the disclosure. FIG. 14 is a schematic flowchart illustrating a step of determining an alignment state of light emitting elements by the method of FIG. 13.

Referring to FIGS. 1 to 14, the method of FIG. 13 may be performed by the test device 20 on the display panel 10 of FIG. 1.

The method of FIG. 13 may apply a test voltage to each of the data lines DL1 to DLm (S100).

As described with reference to FIG. 6, the test voltage may be set to be greater than the reference voltage, and the reference voltage may have a voltage level equal to a voltage difference (e.g., 5V−2.5V=2.5V) between a total operating voltage (e.g., 5V) of the light emitting elements LD electrically connected in series and an operating voltage (e.g., 2.5V) of one of the light emitting elements LD. According to an embodiment, the test voltage may be less than or equal to the total operating voltage of the light emitting elements LD electrically connected in series.

As described with reference to FIGS. 9 to 12, a test voltage is applied to the first pad PD1, and the test voltage may be sequentially applied to the data lines DL1 to DL6 through the first demultiplexer DEMUX1. As shown in FIG. 10, in case that the first demultiplexer DEMUX1 includes sub-demultiplexers DEMUX1_1 and DEMUX1_2, a test voltage may be simultaneously applied to some of the data lines DL1 to DL6.

In an embodiment, the first demultiplexer DEMUX1 may sequentially connect sensing lines to the third pads. As described with reference to FIG. 11, the first demultiplexer DEMUX1 may sequentially connect the sensing lines RL1 to RL6 to the first sensing pad PD_S1.

The method of FIG. 13 may apply a gate signal to each of the gate lines (or scan lines SL1 to SLn and sensing lines) (S200).

As described with reference to FIGS. 9 through 12, a gate signal may be applied to the second pad PD2, and the gate signal (or the scan signal) may be sequentially applied to the scan lines SL1 and SL2 through the second demultiplexer DEMUX2. Also, the gate signal (or the sensing scan signal) may be sequentially applied to the sensing scan lines SSL1 and SSL2 through the second demultiplexer DEMUX2.

In an embodiment, while a test voltage is applied to one of the data lines, the gate signal may be sequentially applied to the gate lines.

As described with reference to FIGS. 9 to 12, while the test voltage is applied to the first data line DL1, the scan signals SC1 and SC2 and the sensing scan signals SS1 and SS2 may be sequentially applied to the scan lines SL1 and SL2 and the sensing scan lines SSL1 and SSL2, respectively. Also, while the test voltage is applied to the second data line DL2, the scan signals SC1 and SC2 and the sensing scan signals SS1 and SS2 may be sequentially applied to the scan lines SL1 and SL2 and the sensing scan lines SSL1 and SSL2.

In an embodiment, a gate signal may be simultaneously applied to one of the scan lines and one of the sensing scan lines through the second demultiplexer DEMUX2. As described with reference to FIGS. 9 to 12, the first scan signal SC1 and the first sensing scan signal SS1 may be simultaneously applied to the first scan line SL1 and the first sensing scan line SSL1, and thereafter, the second scan signal SC2 and the second sensing scan signal SS2 may be simultaneously applied to the second scan line SL2 and the second sensing scan line SSL2.

Thereafter, the method of FIG. 13 may measure the sensing voltage applied to an end of the light emitting units EMU (see FIG. 4) of each of the pixels PXL by the pixel circuit PXC (see FIG. 4) in response to the gate signal and the test voltage (S300).

As described with reference to FIGS. 4 and 5, a test voltage may be applied to the gate electrode of the first transistor T1 (or the driving transistor) in response to the gate signal, and an initialization voltage may be supplied to one electrode (i.e., an electrode electrically connected to an end of the light emitting unit EMU) of the first transistor T1 through the sensing line RLj, and thereafter, a sensing voltage changing based on the current flowing through the sensing line RLj may be measured in a state where the supply of the initialization voltage is stopped.

Thereafter, the method of FIG. 13 may determine whether the light emitting elements LD are validly connected in series within the light emitting units EMU of each of the pixels PXL (i.e., the alignment stated of the light emitting elements LD) based on the sensing voltage (S400).

In an embodiment, as shown in FIG. 14, the method of FIG. 13 may determine whether the sensing voltage is greater than the reference voltage (S410) and may determine that the light emitting elements LD are validly connected in series in case that the sensing voltage is greater than the reference voltage (S420).

In contrast, in case that the sensing voltage is less than or equal to the reference voltage, the method of FIG. 13 may determine that at least one of the light emitting elements LD is shorted (S430). A repair operation may be performed on at least one of the light emitting elements LD (or the pixel PXL including the same) determined to be shorted (S440).

Accordingly, luminance deviation due to invalid alignment of at least some of the light emitting elements LD in the pixel PXL may be improved, and display quality may be improved.

Figure 15:
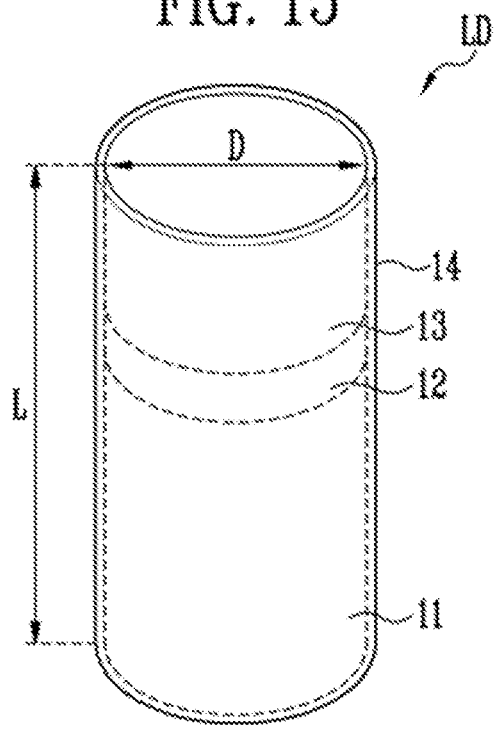
FIG. 15 is a schematic perspective view schematically illustrating a light emitting element used as a light source in the display panel of FIG. 1.
Figure 16:
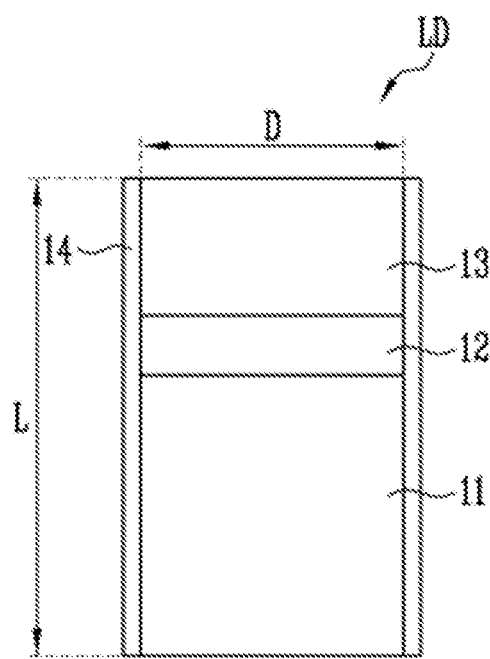
FIG. 16 is a schematic cross-sectional view of the light emitting element of FIG. 15.

FIG. 15 is a perspective view schematically illustrating a light emitting element used as a light source in the display device of FIG. 1. FIG. 16 is a schematic cross-sectional view of the light emitting element of FIG. 15.

In an embodiment of the disclosure, the type and/or shape of the light emitting element is not limited to the embodiments shown in FIGS. 15 and 16.

Referring to FIGS. 15 and 16, the light emitting element LD may include a first semiconductor layer 11, a second semiconductor layer 13, and an active layer 12 interposed between the first and second semiconductor layers 11 and 13. For example, the light emitting element LD may be implemented as a light emitting stacking member in which the first semiconductor layer 11, the active layer 12, and the second semiconductor layer 13 are sequentially stacked.

The light emitting element LD may be provided in a shape extending in a direction. In case that the extending direction of the light emitting element LD is referred to as the longitudinal direction, the light emitting element LD may include an end (or a lower end) and another end (or an upper end) in the longitudinal direction. At an end (or the lower end) of the light emitting element LD, one of the first and second semiconductor layers 11 and 13 may be disposed, and at another end (or the upper end) of the light emitting element LD, the other of the first and second semiconductor layers 11 and 13 may be disposed. For example, the first semiconductor layer 11 may be disposed at the end (or the lower end) of the light emitting element LD, and the second semiconductor layer 13 may be disposed at the another end (or the upper end) of the light emitting element LD.

The light emitting element LD may be provided in various shapes. For an example, the light emitting element LD may have a rod-like shape or a bar-like shape that is long in the longitudinal direction (i.e., with an aspect ratio greater than 1). In an embodiment of the disclosure, a length L of the light emitting element LD in the length direction may be greater than a diameter D (or a width of a transverse cross-section) thereof. The light emitting element LD may include a light emitting diode (LED) manufactured in an ultra-small size enough to have a diameter (D) and/or a length (L) of a micro scale or a nano scale.

The diameter D of the light emitting element LD may be about 0.5 µm to about 500 µm, and the length L thereof may be about 1 µm to about 10 µm. However, the diameter (D) and length (L) of the light emitting element LD are not limited thereto, and the size of the light emitting element LD may be changed to meet requirements (or design conditions) of a lighting device or a self-luminous display device to which the light emitting element LD is applied.

The first semiconductor layer 11 may include at least one n-type semiconductor layer. For example, the first semiconductor layer 11 may include one semiconductor material of InAlGaN, GaN, AlGaN, InGaN, AlN, and InN and may be an n-type semiconductor layer doped with a first conductive dopant (or an n-type dopant) such as Si, Ge, Sn, and the like. However, the material constituting the first semiconductor layer 11 is not limited thereto, and various other materials may constitute the first semiconductor layer 11. In an embodiment of the disclosure, the first semiconductor layer 11 may include a gallium nitride (GaN) semiconductor material doped with the first conductive dopant (or the n-type dopant). The first semiconductor layer 11 may include an upper surface contacting the active layer 12 and a lower surface exposed to the outside in the length direction (L) of the light emitting element LD. The lower surface of the first semiconductor layer 11 may be the end (or the lower end) of the light emitting element LD.

The active layer 12 may be disposed on the first semiconductor layer 11 and may be formed in a single or multiple quantum well structure. For example, in case that the active layer 12 is formed in a multiple-quantum well structure, the active layer 12 may have a structure that a barrier layer (not shown), a strain reinforcing layer, and a well layer are periodically stacked as a unit. Since the strain reinforcing layer has a smaller lattice constant than the barrier layer, it may further strengthen a strain applied to the well layer, for example, a compression strain. However, the structure of the active layer 12 is not limited to the above-described embodiment.

The active layer 12 may emit light having a wavelength of about 400 nm to about 900 nm and may use a double heterostructure. In an embodiment of the disclosure, a clad layer (not shown) doped with a conductive dopant may be formed on and/or under the active layer 12 in the length direction (L) of the light emitting element LD. For example, the cladding layer may be formed of an AlGaN layer or an InAlGaN layer. According to an embodiment, the material such as AlGaN, AlInGaN, and the like may be used to form the active layer 12, and various materials may form the active layer 12. The active layer 12 may include a first surface contacting the first semiconductor layer 11 and a second surface contacting the second semiconductor layer 13.

In case that an electric field of a predetermined voltage or more is applied to ends (or opposite ends) of the light emitting element LD, the light emitting element LD emits light by forming electron-hole pairs in the active layer 12. By controlling the light emitting of the light emitting element LD using this principle, the light emitting element LD may be used as a light source (or light emitting source) of various light emitting devices including pixels of a display device.

The second semiconductor layer 13 may be disposed on the second surface of the active layer 12 and may include a semiconductor layer of a different type from the first semiconductor layer 11. For example, the second semiconductor layer 13 may include at least one p-type semiconductor layer. For example, the second semiconductor layer 13 may include at least one semiconductor material of InAlGaN, GaN, AlGaN, InGaN, AlN, InN and may include a p-type semiconductor layer doped with a second conductive dopant (or a p-type dopant) such as Mg. However, the material constituting the second semiconductor layer 13 is not limited thereto, and various other materials may form the second semiconductor layer 13. In an embodiment of the disclosure, the second semiconductor layer 13 may include a gallium nitride (GaN) semiconductor material doped with the second conductive dopant (or the p-type dopant). The second semiconductor layer 13 may include a lower surface contacting the second surface of the active layer 12 in the length direction (L) of the light emitting element LD and an upper surface exposed to the outside. Here, the upper surface of the second semiconductor layer 13 may be the another end (or the upper end) of the light emitting element LD.

In an embodiment of the disclosure, the first semiconductor layer 11 and the second semiconductor layer 13 may have different thicknesses in the length direction (L) of the light emitting element LD. For example, the first semiconductor layer 11 may have a relatively thicker thickness than the second semiconductor layer 13 in the length direction (L) of the light emitting element LD. Accordingly, the active layer 12 of the light emitting element LD may be disposed closer to the upper surface of the second semiconductor layer 13 than the lower surface of the first semiconductor layer 11.

Each of the first semiconductor layer 11 and the second semiconductor layer 13 are illustrated as being a single layer, the disclosure is not limited thereto. In an embodiment of the disclosure, according to the material of the active layer 12, each of the first semiconductor layer 11 and the second semiconductor layer 13 may further include at least one or more layers, for example, a cladding layer and/or tensile strain barrier reducing (TSBR) layer. The TSBR layer may be a strain mitigating layer that is disposed between semiconductor layers having different lattice structures and serves as a buffer for reducing a difference in lattice constant. The TSBR layer may be composed of a p-type semiconductor layer such as p-GaInP, p-AlInP, p-AlGaInP, and the like, but the disclosure is not limited thereto.

According to an embodiment, the light emitting element LD may further include an additional electrode (not shown, hereinafter referred to as "first additional electrode") disposed on the second semiconductor layer 13 in addition to the first semiconductor layer 11, the active layer 12, and the second semiconductor layer 13 described above. According to another embodiment, the light emitting element LD may further include another additional electrode (not shown, hereinafter referred to as "second additional electrode") disposed at an end of the first semiconductor layer 11.

Each of the first and second additional electrodes may be an ohmic contact electrode, but the disclosure is not limited thereto. According to an embodiment, the first and second additional electrodes may be Schottky contact electrodes. The first and second additional electrodes may include a conductive material (or substance). For example, the first and second additional electrodes may include an opaque metal used alone or in combination with chromium (Cr), titanium (Ti), aluminum (Al), gold (Au), nickel (Ni), and oxides or alloys thereof, but the disclosure is not limited thereto. According to an embodiment, the first and second additional electrodes may include a transparent conductive oxide such as indium tin oxide (ITO), indium zinc oxide (IZO), zinc oxide (ZnO, zinc oxide), indium gallium zinc oxide (IGZO), or indium tin zinc oxide (ITZO).

Materials included in the first and second additional electrodes may be the same as or different from each other. The first and second additional electrodes may be substantially transparent or translucent. Accordingly, light generated by the light emitting element LD may transmit each of the first and second additional electrodes to be emitted to the outside of the light emitting element LD. According to an embodiment, in case that the light generated by the light emitting element LD is emitted outside the light emitting element LD through a region other than both ends of the light emitting element LD without transmitting the first and second additional electrodes, the first and second additional electrodes may include an opaque metal.

In an embodiment of the disclosure, the light emitting element LD may further include an insulation film 14. However, according to an embodiment, the insulation film 14 may be omitted and may be provided to cover or overlap only a portion of the first semiconductor layer 11, the active layer 12, and the second semiconductor layer 13.

The insulation film 14 may prevent an electrical short which may occur in case that the active layer 12 contacts conductive materials other than the first and second semiconductor layers 11 and 13. The insulation film 14 may minimize surface defects of the light emitting element LD, thereby improving lifespan and luminous efficiency of the light emitting element LD. In case that light emitting elements LD are closely disposed, the insulation film 14 may prevent unwanted short circuits that may occur between the light emitting elements LD. As long as preventing the active layer 12 from a short circuit with an external conductive material, the insulation film 14 may be or may not be provided.

The insulation film 14 may entirely surround an outer peripheral surface of the light emitting stacking member including the first semiconductor layer 11, the active layer 12, and the second semiconductor layer 13.

In the above-described embodiment, the insulating film 14 has been described as entirely surrounding the outer peripheral surfaces of each of the first semiconductor layer 11, the active layer 12, and the second semiconductor layer 13, but the disclosure is not limited thereto. According to an embodiment, in case that the light emitting element LD includes the first additional electrode, the insulation film 14 may entirely surround the outer peripheral surface of each of the first semiconductor layer 11, the active layer 12, the second semiconductor layer 13, and the first additional electrode. According to another embodiment, the insulation film 14 may not entirely surround the outer peripheral surface of the first additional electrode or may surround only a portion of the outer peripheral surface of the first additional electrode and may not surround the rest of the outer peripheral surface of the first additional electrode. According to an embodiment, in case that the first additional electrode is disposed at the another end (or the upper end) of the light emitting element LD and the second additional electrode is disposed at the end (or the lower end) of the light emitting element LD, the insulation film 14 may expose at least a portion of each of the first and second additional electrodes.

The insulation film 14 may include a transparent insulation material. For example, the insulation film 14 may include at least one insulating material selected from the group consisting of silicon oxide ($SiO_x$), silicon nitride ($SiN_x$), silicon oxynitride (SiON), aluminum oxide ($AlO_x$), and titanium dioxide ($TiO_2$), and the like, but the disclosure is not limited thereto, and various materials having insulating properties may be used as a material of the insulating film 14.

The light emitting element LD described above may be used as a light emitting source for various display devices. The light emitting element LD may be manufactured through a surface treatment process. For example, in case that light emitting elements LD is mixed with a fluid solution (or solvent) and supplied to each light emitting area (e.g., light emitting area of each pixel or light emitting area of each sub-pixel), each light emitting element LD may be surface-treated so that the light emitting elements LD may be uniformly sprayed without non-uniform agglomeration in the solution.

The light emitting unit (or the light emitting device) including the light emitting element LD described above may be used in various types of electronic devices requiring a light source, including a display device. For example, in case that light emitting elements LD are disposed in a pixel area of each pixel of the display panel, the light emitting elements LD may be used as light sources of each pixel. However, a field of application of the light emitting element LD is not limited to an embodiment described above. For example, the light emitting element LD may be used for other types of electronic devices that include a light source, such as a lighting device.

While the disclosure has been shown and described with reference to some embodiments thereof, it will be understood by those skilled in the art that various changes in forms and details may be made therein without departing from the spirit and scope of the disclosure and their equivalents, and the technical scope of the claimed invention shall be determined by the accompanying claims.

What is claimed is:

1. A method of testing a display panel which includes pixels electrically connected to gate lines and data lines, each of the pixels including a pixel circuit electrically connected to a corresponding one of the gate lines and a corresponding one of the data lines, and a light emitting unit including an end electrically connected to the pixel circuit, comprising:
applying a test voltage to each of the data lines;
applying a gate signal to each of the gate lines;
measuring a sensing voltage applied to the end of the light emitting unit of each of the pixels by the pixel circuit in response to the gate signal and the test voltage; and
determining whether light emitting elements are validly connected in series in the light emitting unit of each of the pixels based on the sensing voltage.

2. The method of claim 1, wherein
the test voltage is greater than a reference voltage, and
the reference voltage is equal to a voltage difference between a total operating voltage of the light emitting elements electrically connected in series and an operating voltage of one of the light emitting elements.

3. The method of claim 2, wherein the test voltage is less than or equal to the total operating voltage of the light emitting elements.

4. The method of claim 2, wherein the determining of whether the light emitting elements are validly connected in series includes determining that all of the light emitting elements are validly aligned in case that the sensing voltage is greater than the reference voltage.

5. The method of claim 2, wherein the determining of whether the light emitting elements are validly connected in series includes determining that at least one of the light emitting elements is invalidly aligned in case that the sensing voltage is less than or equal to the reference voltage.

6. The method of claim 5, further comprising:
in case that the sensing voltage is less than or equal to the reference voltage, determining that the at least one of the light emitting elements is short-circuited; and
physically opening the at least one of the light emitting elements by a repair process.

7. The method of claim 1, wherein the applying of the test voltage to each of the data lines includes:
applying the test voltage to a first pad; and
sequentially applying the test voltage to at least a part of the data lines through a first demultiplexer electrically connected between the first pad and the data lines.

8. The method of claim 7, wherein
the first demultiplexer includes sub-demultiplexers, and
the sequentially applying of the test voltage to the at least a part of the data lines includes applying simultaneously the test voltage to a part of the data lines through the sub-demultiplexers.

9. The method of claim 7, wherein the applying of the gate signal to each of the gate lines includes:
applying the gate signal to a second pad; and
sequentially applying the gate signal to the gate lines through a second demultiplexer electrically connected between the second pad and the gate lines.

10. The method of claim 9, wherein the sequentially applying of the gate signal to the gate lines includes sequentially applying the gate signal to the gate lines while the test voltage is applied to one of the data lines.

11. The method of claim 9, wherein
the display panel further comprises sensing scan lines and sensing lines,
the pixel circuit includes a sensing transistor electrically connected between the end of the light emitting unit and a corresponding one of the sensing lines, the sensing transistor including a gate electrode electrically connected to a corresponding one of the sensing scan lines, and
the gate signal is simultaneously applied to one of the gate lines and one of the sensing lines through the second demultiplexer.

12. The method of claim 11, wherein the first demultiplexer sequentially connects at least a part of the sensing lines to third pads.

13. The method of claim 1, wherein the measuring of the sensing voltage includes:
applying the test voltage to a gate electrode of a driving transistor in the pixel circuit in response to the gate signal;
supplying an initialization voltage to an electrode of the driving transistor electrically connected to the end of the light emitting unit through a sensing line;
stopping supply of the initialization voltage while the test voltage is applied; and
measuring the sensing voltage changed based on a current flowing through the sensing line.

* * * * *